United States Patent
Michelsen et al.

(10) Patent No.: US 11,469,527 B2
(45) Date of Patent: Oct. 11, 2022

(54) METHOD FOR PROVIDING AN ELECTRICALLY CONDUCTIVE POWER TRANSMISSION INTERFACE, INTERFACE-FORMING DEVICE AND USE OF A COLD SPRAYING APPARATUS FOR FORMING A POWER TRANSMISSION INTERFACE

(71) Applicant: RELIBOND APS, Copenhagen NV (DK)

(72) Inventors: Christian Michelsen, Valby (DK); Soren Isaksen, Lejre (DK); Martin Sander Nielsen, Frederiksberg (DK)

(73) Assignee: RELIBOND APS, Copenhagen NV (DK)

( * ) Notice: Subject to any disclaimer, the term of this patent is extended or adjusted under 35 U.S.C. 154(b) by 0 days.

(21) Appl. No.: 16/330,467

(22) PCT Filed: Sep. 5, 2017

(86) PCT No.: PCT/DK2017/050281
§ 371 (c)(1),
(2) Date: Mar. 5, 2019

(87) PCT Pub. No.: WO2018/041321
PCT Pub. Date: Mar. 8, 2018

(65) Prior Publication Data
US 2019/0229436 A1    Jul. 25, 2019

(30) Foreign Application Priority Data

Sep. 5, 2016  (DK) .............................. PA201600517
Mar. 14, 2017  (DK) .............................. PA201700180

(51) Int. Cl.
*H01R 4/02*  (2006.01)
*C23C 24/04*  (2006.01)
(Continued)

(52) U.S. Cl.
CPC .............. *H01R 4/021* (2013.01); *C23C 24/04* (2013.01); *H01R 43/28* (2013.01); *H02G 1/14* (2013.01);
(Continued)

(58) Field of Classification Search
CPC .. C23C 4/04; C23C 4/06; H01R 43/28; H01R 4/021; H02G 15/117; H02G 1/14
See application file for complete search history.

(56) References Cited

U.S. PATENT DOCUMENTS 1,904,162 A * 4/1933 Milliken ................ H01B 7/306
                                                        174/114 S
3,402,758 A * 9/1968 Cushman ............... B22D 19/14
                                                        164/108
(Continued)

FOREIGN PATENT DOCUMENTS

CN         102859799 A      1/2013
CN         105008063 A     10/2015
(Continued)

OTHER PUBLICATIONS

Danish Office Action; Reference No. PA 2017 00180; Danish Patent and Trademark Office, Helgeshej Alie 81,DK-2630 Taastrup; dated Jun. 12, 2017; pp. 9.
(Continued)

*Primary Examiner* — William H. Mayo, III
*Assistant Examiner* — Rhadames Alonzo Miller
(74) *Attorney, Agent, or Firm* — Buchanan Ingersoll & Rooney P.C.

(57) ABSTRACT

The present invention relates to an interface-forming device (x60) and a method for providing an electrically conductive power transmission interface (x30) on the end surface of a power cable (xOO) having at least two separate wires (x02) being electrically conductive, the cable (xOO) further com-
(Continued)

Figure 3:
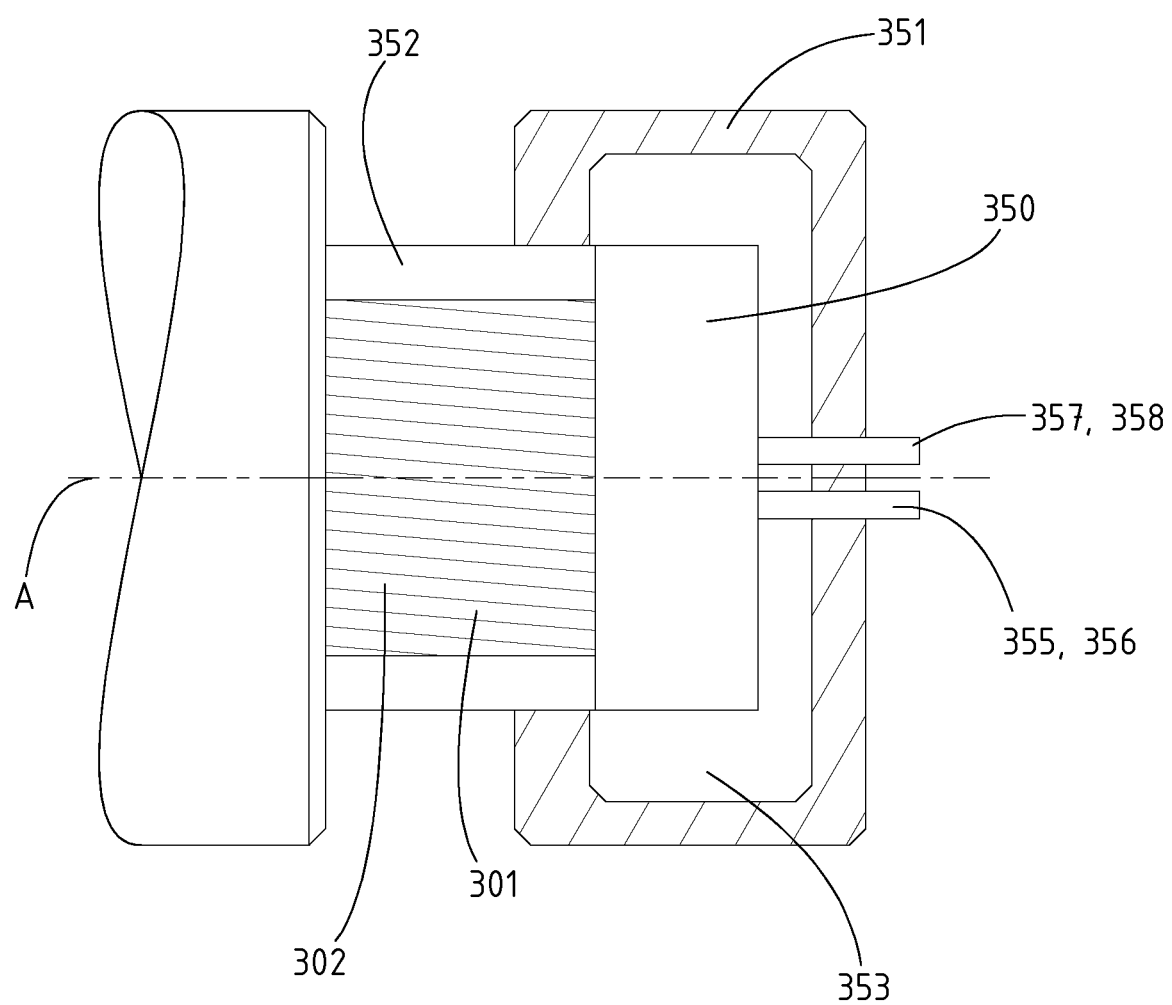

prising a reactive compound different from the wires (x02) for providing further features to the power cable (xOO). The method comprises the steps of providing an end section of the power cable (xOO), the end section comprising wires (x02) having wire ends, the end section further having the reactive compound, and successively adding electrically conductive particulates (x67A) onto the end section by bringing the conductive particulates being dispersed in a carrier fluid of a different material than the conductive particulates into contact with the end section. Thereby, cable joining and terminations are achieved of a higher quality.

17 Claims, 13 Drawing Sheets

(51) Int. Cl.
    *H01R 43/28* (2006.01)
    *H02G 1/14* (2006.01)
    *H02G 15/117* (2006.01)
    *H01B 7/14* (2006.01)
    *H02G 15/08* (2006.01)

(52) U.S. Cl.
    CPC .............. *H02G 15/117* (2013.01); *H01B 7/14* (2013.01); *H02G 15/08* (2013.01)

(56) References Cited

U.S. PATENT DOCUMENTS

| | | | |
|---|---|---|---|
| 4,512,828 A | 4/1985 | Helm | |
| 5,606,149 A * | 2/1997 | Yaworski | H02G 15/184 174/92 |
| 2009/0252986 A1* | 10/2009 | Owen | C23F 13/06 428/623 |
| 2010/0051718 A1* | 3/2010 | Vanderzwet | B05B 7/1486 239/135 |
| 2010/0326512 A1* | 12/2010 | Berek | H01L 31/0322 136/256 |
| 2011/0177358 A1* | 7/2011 | Horton | F16L 9/147 428/640 |
| 2011/0289765 A1* | 12/2011 | Bohn | C23C 24/04 29/605 |
| 2013/0072075 A1* | 3/2013 | Kayamoto | C23C 24/04 439/887 |
| 2013/0244471 A1 | 9/2013 | Andrew et al. | |
| 2014/0000110 A1* | 1/2014 | Stauch | H02G 15/08 29/869 |
| 2014/0007421 A1 | 1/2014 | Portas et al. | |
| 2014/0134456 A1* | 5/2014 | Horton | C23C 4/08 428/632 |
| 2014/0166474 A1* | 6/2014 | Horton | C23C 28/3225 204/196.1 |
| 2015/0005939 A1 | 1/2015 | Stefano et al. | |
| 2015/0075864 A1* | 3/2015 | Boedec | H01R 4/021 174/75 D |
| 2015/0137398 A1 | 5/2015 | Perez | |
| 2016/0164238 A1 | 6/2016 | Hobson | |
| 2016/0247599 A1 | 8/2016 | Schmidt et al. | |
| 2018/0042119 A1* | 2/2018 | Dantin | C23C 4/08 |

FOREIGN PATENT DOCUMENTS

| | | |
|---|---|---|
| CN | 104439383 B | 5/2017 |
| DE | 10223397 | 5/2004 |
| DE | 102010039594 A1 | 2/2012 |
| EP | 2209161 A1 | 7/2010 |
| EP | 2821159 B1 | 8/2016 |
| JP | S58138574 A | 8/1983 |
| JP | 2007-012999 A | 1/2007 |
| JP | 2013030338 A | 2/2013 |
| JP | 2016-517472 A5 | 6/2016 |
| WO | 2014/149996 A2 | 9/2014 |
| WO | 2014206474 A1 | 12/2014 |
| WO | 2015188923 A1 | 12/2015 |

OTHER PUBLICATIONS

International Search Report for International application No. PCT/DK2019/050081 dated Jul. 12, 2019.
Search Report for Danish application No. PA 2018 00104 dated Jun. 13, 2018.
Search Report for Danish application No. PA 2017 00180 dated Jun. 12, 2017.
Written Opinion of the International Searching Authority; International application No. PCT/DK2017/050281; International filing date May 9, 2017; International Searching Authority; pp. 1-5.
Written Opinion of the International Searching Authority; International application No. PCT/DK2019/050081; International filing date Mar. 6, 2019; International Searching Authority; pp. 1-8.
Examination Report. Application No. 17 787 104.3-1201. European Patent Office. Rijswijk, Netherlands. dated Jun. 11, 2020. 4 pp.
Office Action (Notification of the Third Office Action) dated Aug. 3, 2021 by the National Intellectual Property Administration, PRC in corresponding Chinese Patent Application No. 201780068498.7, and an English Translation of the Office Action. (12 pages).
Office Action (Notice of Reasons for Refusal) dated Jun. 22, 2021 by the Japanese Patent Office in corresponding Japanese Patent Application No. 2019-533277, and an English Translation of the Office Action. (8 pages).

* cited by examiner

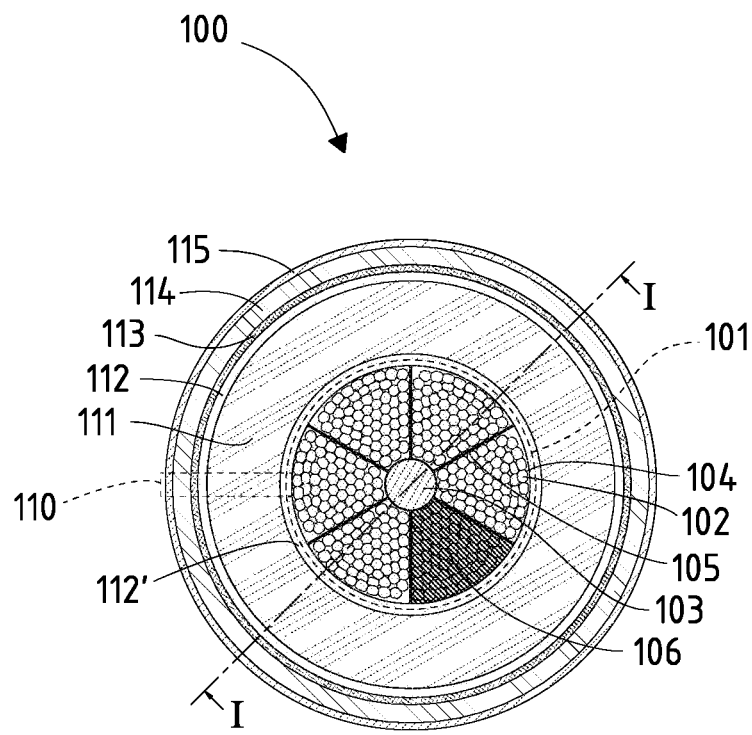
Fig. 1A
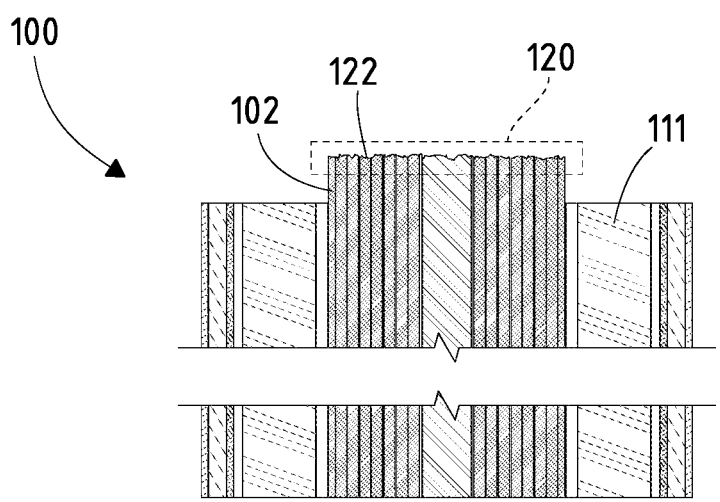
Section view I-I
Fig. 1B
Fig. 1

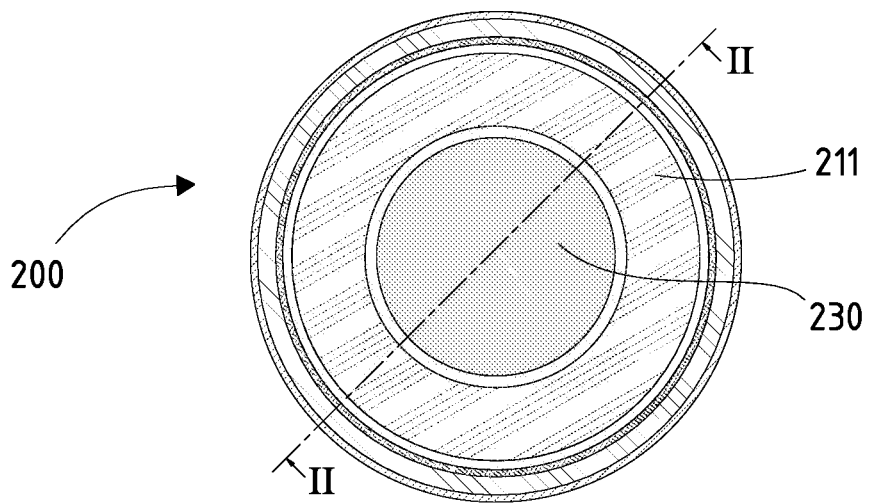
Fig. 2A
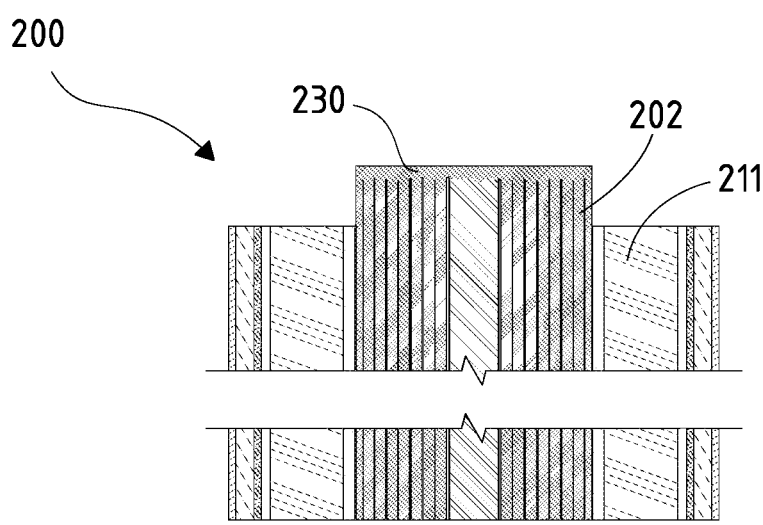
Section view II-II
Fig. 2B
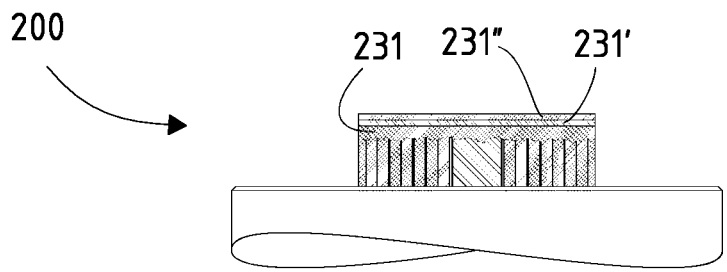
Fig. 2C
Fig. 2

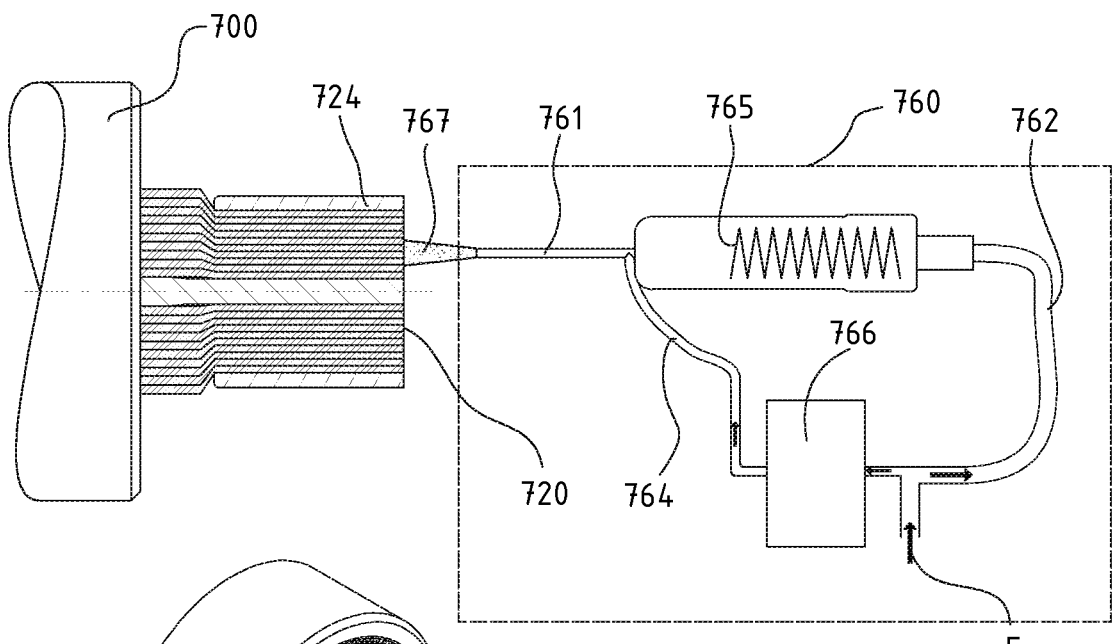
Fig. 13.A
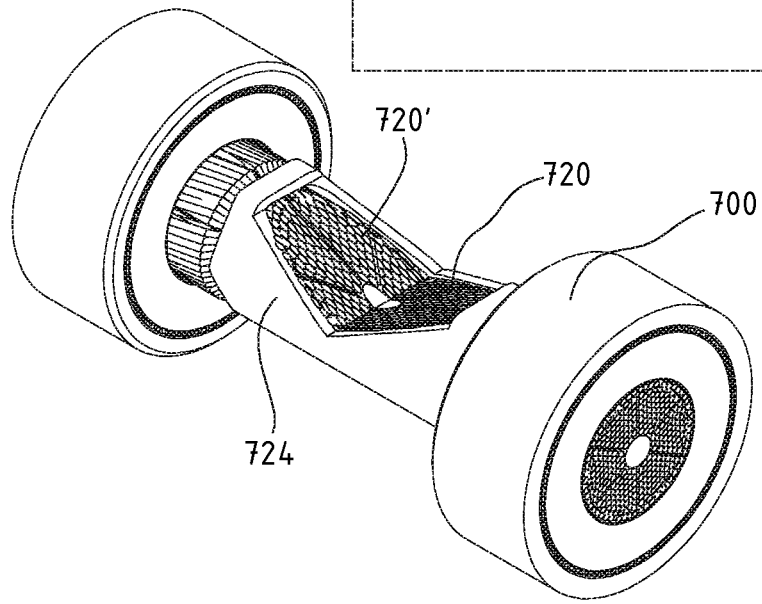
Fig. 13.B
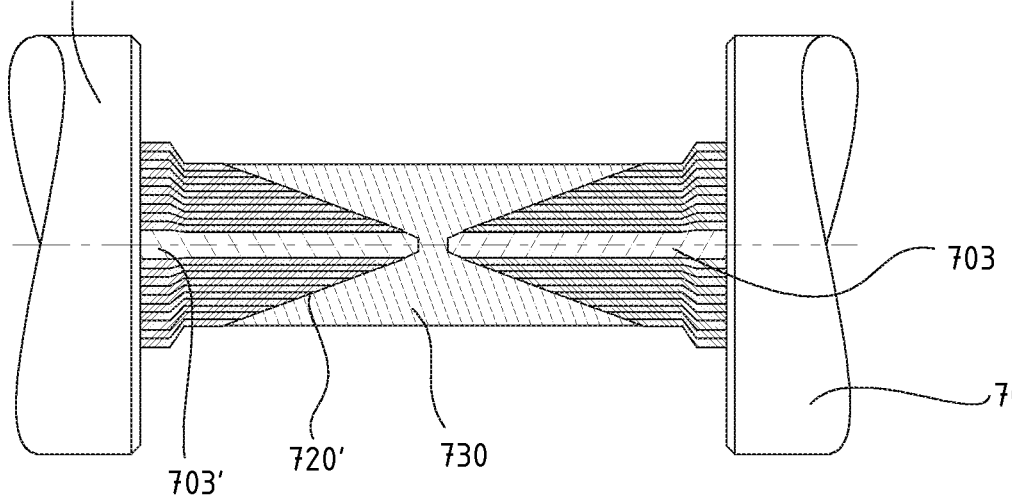
Fig. 13.C

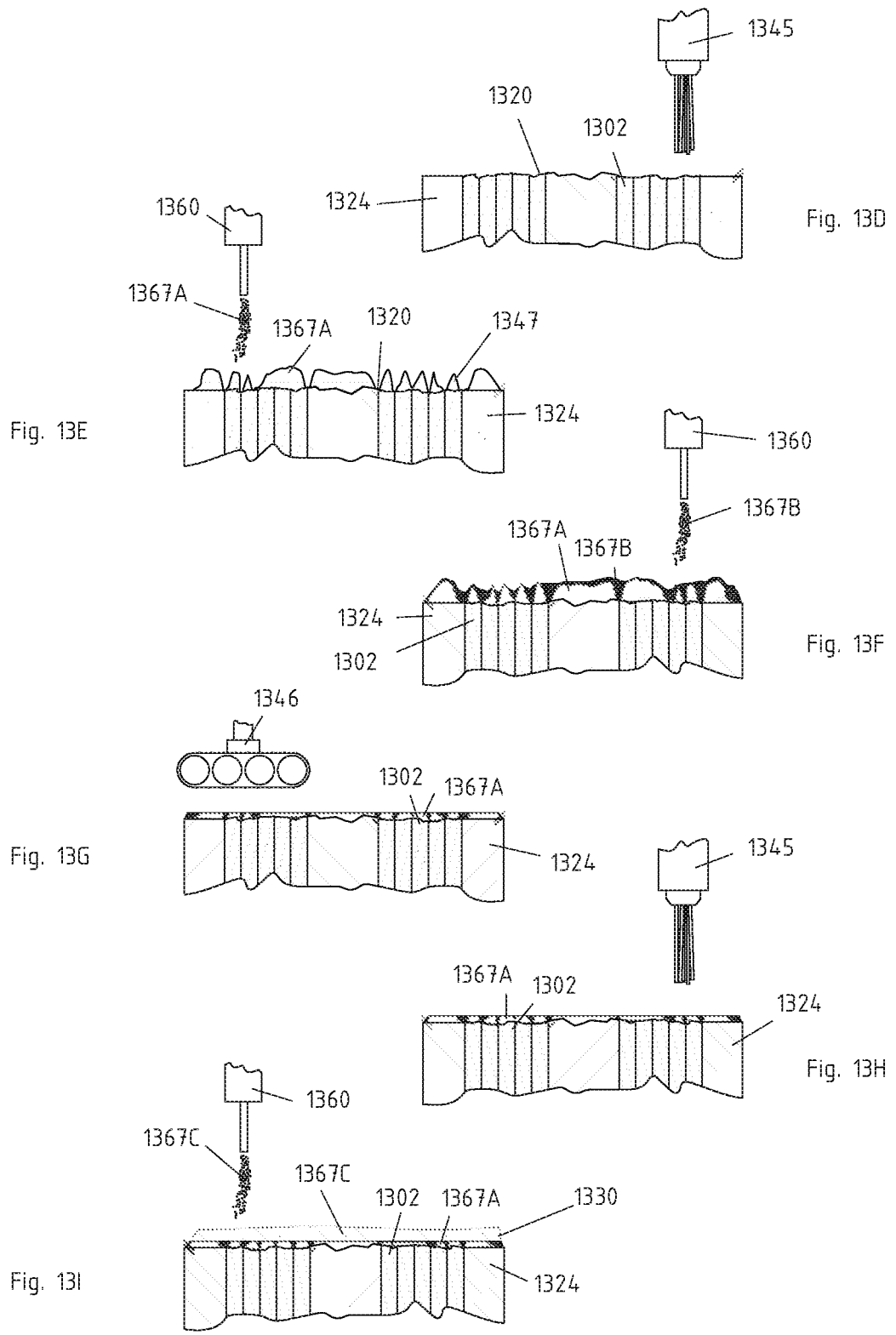

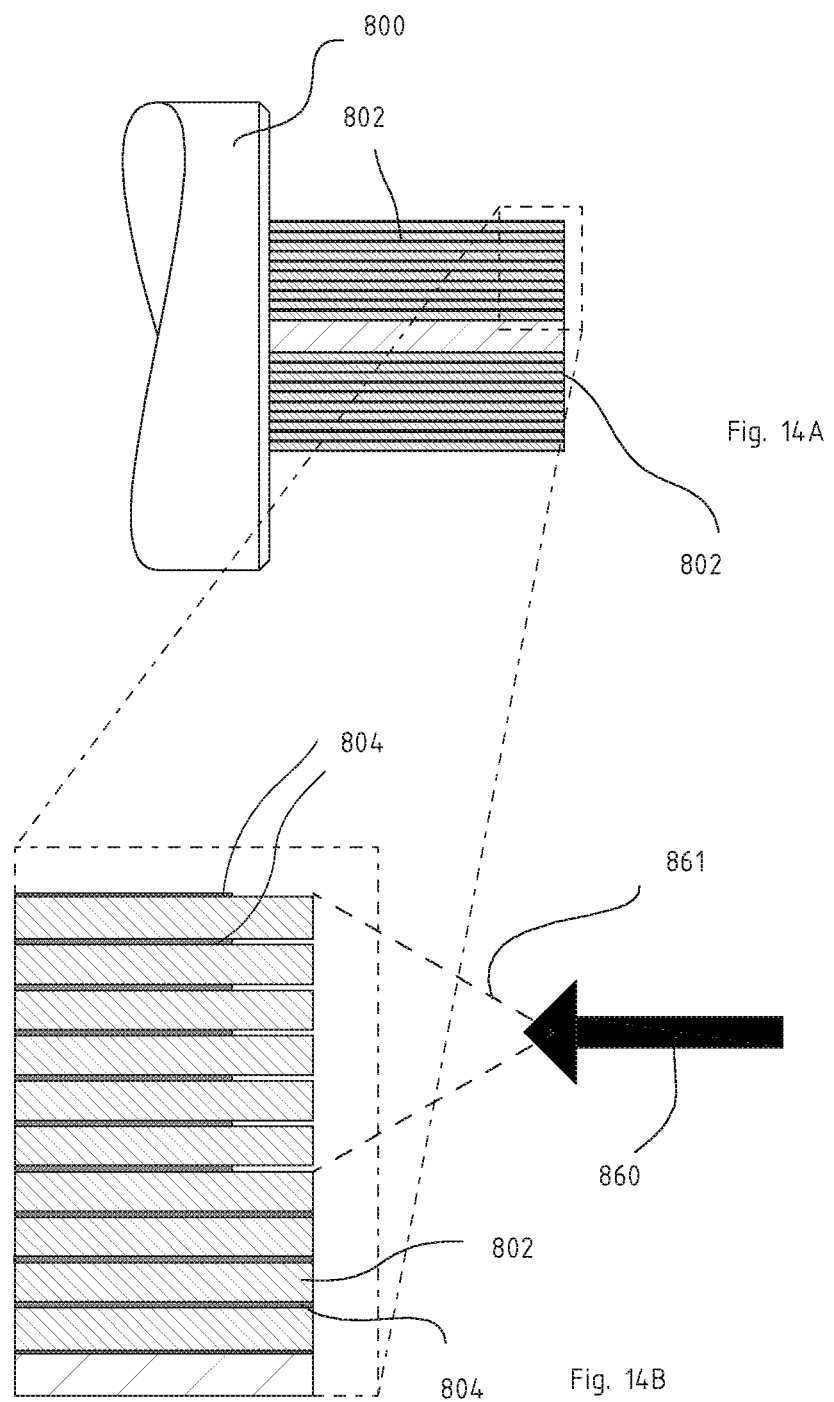

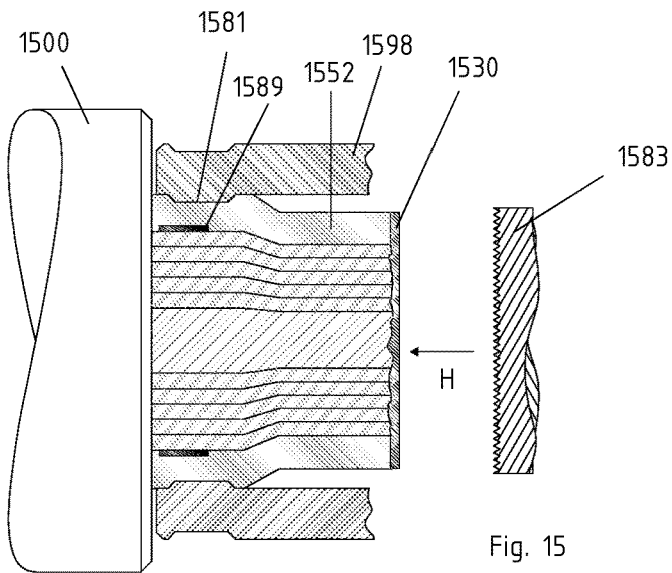
Fig. 15
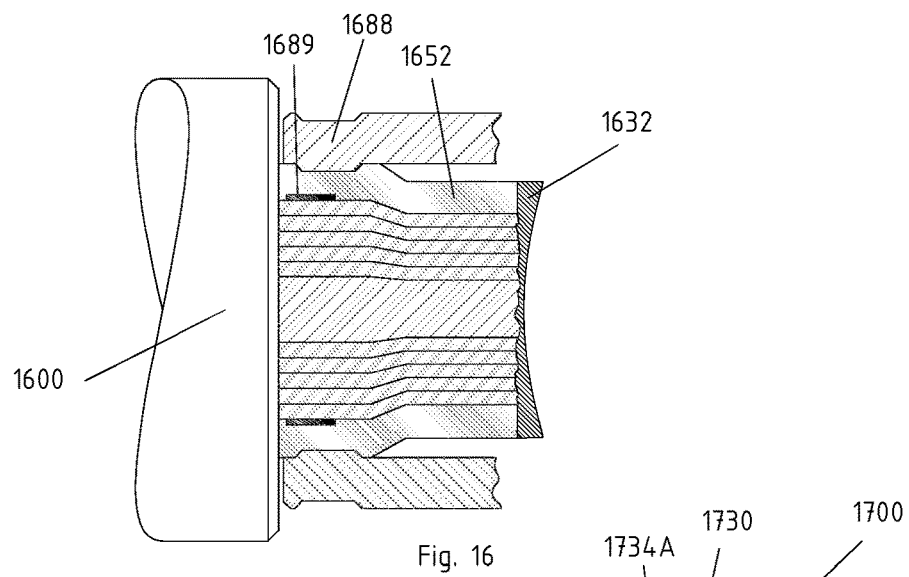
Fig. 16
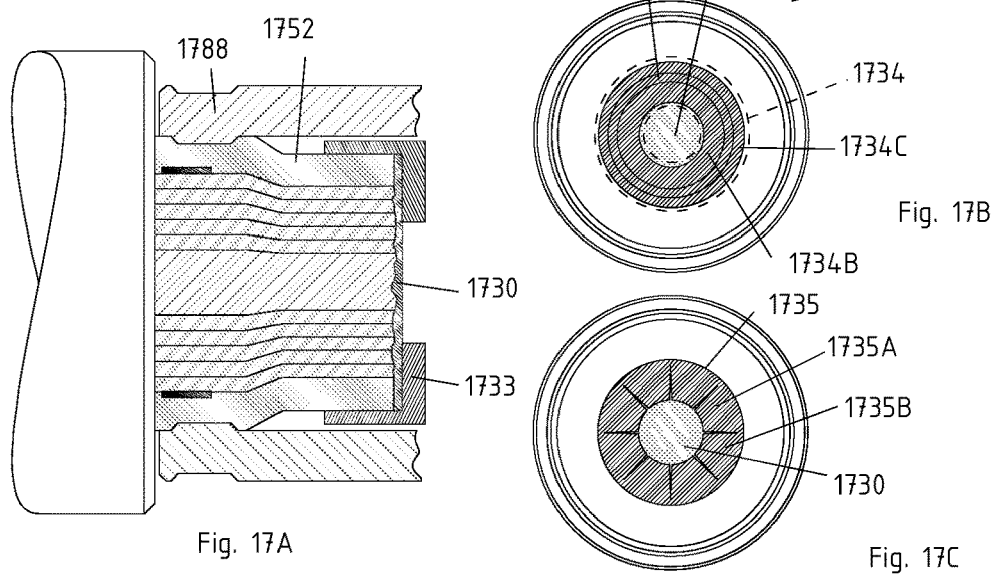
Fig. 17A
Fig. 17B
Fig. 17C

METHOD FOR PROVIDING AN ELECTRICALLY CONDUCTIVE POWER TRANSMISSION INTERFACE, INTERFACE-FORMING DEVICE AND USE OF A COLD SPRAYING APPARATUS FOR FORMING A POWER TRANSMISSION INTERFACE

FIELD OF THE INVENTION

The invention relates to a method and apparatus for providing a power transmission interface on a power cable having at least two wires or sectors and a reactive compound, and to a cable with such a power transmission interface. Furthermore, the invention relates to a sleeve for terminating or joining such a cable with such a power transmission interface.

BACKGROUND OF THE INVENTION

Cable termination and joining is important in the art, and for certain cable types, this is a cumbersome process.

Several methods have been used to terminate and join cables. Firstly, most simple or small cables are simply welded or soldered, or connected using shear bolts. For other cable types such as cables having insulated wires, the extra compounds in the cable reacts during welding or soldering and contaminates the termination or joint. Therefore, such reactive compounds then have to be removed for an end section of the cable before welding, soldering or mechanically terminating joining of the cable.

After the insulation is removed and optionally after a cleaning process to ensure no left-over residue persists among wires, the wire ends of a cable are either welded or soldered together, crimped together, or shear-bolted together using a ferrule to mechanically fixate and electrically contacting the wires/strands. All these methods produce a cable termination for field joining or termination, or for obtaining a single contact point for characterisation of the cable parameters during or between production runs.

For large cable types such as high-voltage transmission cables, the field and manufacturing work to de-isolate wires and cleaning the wires produces a bottleneck, where all other processes may stay on hold for days at a time, which is expensive. Further, specialist labour is required to de-isolate the wires.

During characterising of a cable, small sections can be used of for example one metre, where the electrical properties of the cable is characterised. Since the insulation is removed by hand, the precise effective lengths of each individual strand of a given cable cannot be measured effectively. For small cable lengths, these deviations are amplified and result in significant data bias, disallowing precise quality control. Since cable manufacturers are liable for underperforming cable systems, cables may then be over-dimensioned to ensure that they meet specifications thus resulting in lost profits.

Other cable joining/termination situations which are problematic relate to submarine cables, substations and factory joints. To ensure as few field joints as possible, cables intended for submarine use are pre-joined at the factory to create as long cable pieces as possible. Still, all joints cannot always be made beforehand and when submarine cable links are damaged or have other failures repair joints are necessary. Submarine cables are laid and repaired by specialised vessels, where savings in the time used for cable joining is important in order to be able to make such installation or cable repairs within as short a time frame as possible.

Factory joints, such as those for making cables for submarine use, may require the cable joint to meet extensive mechanical specifications. As the joint is simply rolled up as any other piece of cable and subsequently laid to the submarine location, the joint must have at least substantially similar mechanical strength, size and flexibility as a similar length of the cable itself.

US 2014/00001 10 discloses a method for electrically connecting the electrical conductors of two high voltage cables. The conductors are exposed at their ends and inserted into a pipe from either end and fastened with securing screws to the pipe, the pipe having central through-holes. Bores are made into the conductors in radial direction. Conductive screws are screwed into the bores in the interface between two conductor ends. Though perhaps an improved connection over the art, connection to all strands is not guaranteed, and the quality of the joint is based to a high degree on the skill of the individual operator. Using more screws increases connection but also the risk of fracturing strands. Also, using screws of a different material than the conductor, produces thermal expansion problems reducing connection after a time, while using the same material as the conductor produces screw strength problems thus increasing the risk of not connecting to all strands. Further, the abutment contact between the screws and each individual strand will at least vary among strands thus producing a termination with irregular electrical connection.

WO 2015/188923 discloses a device for contacting an electrical conductor to another electrical conductor, in particular for multi-stranded conductor of a power supply cable. The device has a receiving space for inserting the conductor and a contact medium having electrically conductive and abutting contact bodies such as conductive metal balls. Under an applied force, the conductor can be electrically contacted to the conductive metal balls. However, effective contact between the conductive metal balls and each strand of the cable is not guaranteed, but is based on the size of the balls, where smaller balls ensure better overall connection but may lead to too high or an unstable resistance during operation as a result of an increased number of abutments. Further, the number of ball-to-ball transitions, which the electrical current has to pass, will vary among strands thus producing a termination with irregular electrical connection.

The aim is thus to provide a device and method for providing a contact interface to an electrical conductor, in particular a multi-stranded conductor of an electrical power cable and a connection or connection means with such an apparatus which overcome at least some of the above-mentioned problems.

SUMMARY OF THE INVENTION

The object of the invention is to solve some of the above-mentioned problems. In accordance with the invention there is provided a method and an apparatus.

In accordance with the invention, at least some of the above-mentioned problems are solved by a method for providing an electrically conductive power transmission interface on the end surface of a power cable having at least two separate wires being electrically conductive, where the cable further comprises a reactive compound different from the wires for providing further features to the power cable. The method comprises the steps of: providing an end section of said power cable, the end section having wires having wire ends, and where the end section further has the reactive compound; and successively adding electrically conductive particulates onto said end section, where the conductive particulates are dispersed in a carrier fluid of a different material than said conductive particulates into contact with said end section.

Thereby, a process is provided that creates an effective electrical connection between wires that also has a mechanical strength. By dispersing the particulates in a fluid of a material different from the particulates, a sufficiently low contact energy is achieved that allows adhesion without excessive heating.

In an embodiment, the method further comprises the step of providing a dispersion of said electrically conductive particulates in a non-adhering carrier fluid of a different material than said conductive particulates. Thereby, the particulates are dispersed in the fluid for deposition onto the end section/end surface of the conductor.

By successively adding is meant that discrete elements follow one another onto the end surface consecutively, continuously and/or successively that may be orderly or disorderly. Numerous particles may be fired onto the end surface, or ions may attach in huge quantities within this definition. Successively adding the electrical conductive material ensures that the thermal energy transfer to the cable end does not significantly heat the cable or the reactive compound, serving to avoid phase transition of the reactive compound, such as melting/liquefying or evaporating or serving to avoid excessive heating of the cable insulation material. The latter-mentioned heating of insulation material is known to otherwise risking to damage or destroy the insulation. Thereby, a significantly better and faster interfacing of the cable end is achieved. Automated and fast interfacing of cables having such reactive compounds is achieved, where the compound does thus not contaminate the interface segment and avoids damaging the cable, allowing an effective transmission having a low electrical resistance while all or substantially all wires are electrically connected. Even further, since individual wires are effectively connected to the interface segment, a uniform transmission among wires is ensured which allows testing quality of conductors unparalleled in the art. Thereby, effective and precise conductor characterization, production and installation are allowed. Successively adding and successively depositing is used interchangeably in the specification and claims.

By particulates is meant ions or solid separate particles. In an embodiment, the particulate material is particulate as it meets the cable end surface. In another embodiment, it may be liquid as it meets the surface.

By the particulates being dispersed in a fluid is meant that the particulate material is mixed with the fluid during deposition onto the conductor end surface, where the fluid may be a liquid or a gas, such as an electrolyte solution or a process gas. The fluid being non-adhering means that it does not adhere to the cable end section or interface segment. Further, by the fluid being a carrier fluid, thereby carrying the particulates, it touches the end section without adhering/attaching to it, whereby it does not interfere with the formation of the interface segment.

In an embodiment, the particulates being dispersed in a fluid does not encompass depositing a shallow metal layer onto the cable end surface prior to being melted by laser.

By end section is meant an end part of the cable, and may be the part that is crimped with a wire restrainer, or it may merely be the end surface.

The reactive compound comprised in the cable may be any material comprised in the cable not being a metallic conductor. Typically, the reactive compound will be one which contributes to contaminate a thermal welding or soldering cable interfacing process, or alternatively, one which is damaged by a thermal welding process, irrespective of where along the cable length this damage occurs. The latter example is for example when a thermal process heats a cable enough to ruin the insulation further down from the end of the cable.

In an embodiment, the reactive compounds may be any material of the conductor that is not a metallic conductor.

Examples are varnish on wires, insulation paper between cable sectors, insulation in the form of PEX/XLPE or PE, any polymers, swelling powder or tape of super absorbent polymers, hygroscopic tape or powder, oil products, bitumen, waxes, epoxies, silicones, asphalts, specialty asphalts, rubber-modified asphalts, gels, solvents based coatings, water based coatings, water, hydrocarbon resins and semiconductor layers or even an oxide layer actively applied. Reactive compounds encompass single compounds and compositions of more complex natures, such as any combination of the above-mentioned example compositions. Many cables will, for various reasons, inadvertently have, benefit from, or need such additional compounds. Submarine cables may need absorbent powder, while multi-stranded cables may need strand insulation, which may then take the form of impregnated paper, varnish or an oxide layer. Many compositions like the ones described make cable termination and joining difficult by producing a contaminant as the cable end is being processed, makes termination or joining of cables of these types expensive and rely on specialist labour.

In another embodiment, the reactive compound is specifically reactive conductor compounds, which means it is compounds present as part of the conductor part of the cable. In other words, the reactive conductor compounds are located among wires/strands of the conductor, either freely or organised in some manner such as being fastened around wires/strands or between cable sectors. Examples are longitudinal water barriers such as swelling powders or tape, super absorbent polymers, absorbent polymers and hygroscopic tape or powder; organic wire insulating coating layers such as polyester imides, polyurethane, polyamide-imide, polyimide, solvents-based coatings and water-based coatings; inorganic wire insulating coating layers such as cupric oxide, aluminium oxide, and electrolytically formed electrically insulating layer coatings; and others like polymers, waxes, epoxies, silicones, gels and hydrocarbon resins.

In embodiments, the invention is useful for any voltage types of cables, including medium voltage, high voltage, extra high voltage and/or ultra-high voltage transmission. By medium voltage power cable is meant power cable with voltage range between 1 kV and 30 kV. High voltage power cable is meant power cable with voltage range between 30 kV and 150 kV. By extra high voltage power cable is meant power cable with voltage range between 150 kV-500 kV. By ultra-high voltage power cable is meant power cable with voltage range from 500 kV and above. In an example, the invention relates to high, extra high and ultra-high voltage transmission cables.

By integrally formed is meant that the interface segment adheres to, and abuts the contour to the individual surfaces of the wire ends, so that any irregularities in the overall contour do not impede the transmission. The interface segment being integrally formed with the wire ends ensures that interfacing is allowed with other elements by supplying a surface that adheres and supplies electrical and mechanical contact to wires of the cable. The interface segment supplies contact to at least two wires, at least 50% of wires where this is at least two wires, at least 60% of the wires, at least 70% of the wires, at least 80% of the wires, at least 90% of the wires, at least 92% of the wires, at least 94% of the wires, at least 95% of the wires, at least 96% of the wires, at least 97% of the wires, at least 97.5% of the wires, at least 98% of the wires, at least 98.5% of the wires, at least 99% of the wires, at least 99.5% of the wires, or 100% of the wires.

The cable end surface may have any shape. It may for example be perpendicular or slightly angled relative to the length of the cable, it may be a tapered cut where the cable ends in a tapered←shape or a pencil shape, it may conform to a zig-zag shape or the end may take any other convenient form. A prominent example is where two cable ends are brought into alignment for joining, a cut may be made substantially symmetrically about where the cable end surfaces meet, producing a V-shaped cut for producing the interface segment.

By segment is meant a portion of a conductor extending lengthwise in the axial direction of the cable and generally being the entire radial extent of the conductor and/or carrying the full electrical load of the conductor. The segment may take any convenient length and may be anything from a single layer of deposited material and up to multiple layers and including forming conductors entirely through the process according to the invention. The segment is preferably of sufficient length to supply mechanical strength for its intended use, and to ensure electrical connection to successfully carry the intended electrical load from among all wires of the conductor and/or from one wire to another wire through the interface segment.

In an embodiment, the method further comprises the steps of providing a local enclosure with an outer wall delimiting its contents from an outside environment. The local enclosure is attached to the affixing means to be fastened securely around the conductor end. The deposition means, as well as the conductor end section it deposits the conductive material onto, are provided in the local enclosure. Thereby, an isolated environment is achieved. This both serves to protect those working with joining the cables as well as provide a stable environment for the process to occur in, which further serves to reduce material usage and increase work speed and reliability.

In an embodiment, said successively adding is continued until said power transmission interface has been integrally formed with said at least two wire ends of said wires. Thereby, a simple process is achieved.

In an embodiment, said forming may be chosen from a list of: cold spraying, electroplating, or laser metal deposition. In an embodiment, the technique for successively adding may be chosen from among cold spraying or electroplating. In an embodiment, the method comprises said forming not being induction welding, friction welding or arc welding. In an embodiment, the forming is not laser-welding. In an embodiment, the method is not welding, where a welding process melts at least part of the wires of the cable end. In an embodiment, the method is not soldering, where soldering adds a melted material onto the cable end surface, producing a melt-zone of the added solder on the cable end surface.

In an embodiment, successively adding is successively cold-adding, where the parameters relating to temperature is controlled to ensure the temperature of the reactive compound remains substantially below a reactive temperature, at which reactive temperature said reactive compound interferes with said successively adding to impede the electrical and/or mechanical properties of said electrically conductive power transmission interface. While the process is generally a cold process compared to the methods in the art, it is understood that a local and momentary heating is allowed. Thereby, a substantially non-damaging process is ensured.

To work with underground cables whose operating temperatures may be 90 degrees Celsius and may even spike to 110 degrees Celsius, the material of the interface segment advantageously has a melting temperature above 90 degrees or above 110 degrees Celsius.

In an embodiment, the reactive compound undergoes phase transition at said reactive temperature. In an embodiment, the reactive temperature is below 50° C., 55° C., 60° C., 65° C., 70° C., 75° C., 80° C., 85° C., 90° C., 95° C., 100° C., 105° C., 110° C., 115° C., 120° C., 125° C., 130° C., 135° C., 140° C., 145° C., 150° C., 155° C., 160° C., 165° C., 170° C., 175° C., 180° C., 185° C., 190° C., 195° C., 200° C., 205° C., 210° C., 215° C., 220° C., 225° C., 230° C., 235° C., 240° C., 245° C., 250° C., 255° C., 260° C., 265° C., 270° C., 275° C., 280° C., 285° C., 290° C., 295° C., 300° C., 305° C., 310° C., 315° C., 320° C., 325° C., 330° C., 335° C., 340° C., 345° C., 350° C., 355° C., 360° C., 365° C., 370° C., 375° C., 380° C., 385° C., 390° C., 395° C. or 399° C. at atmospheric pressure. In embodiments, the effect of the reactive temperature is evaluated by combining it with atmospheric pressure.

In an embodiment, the melting temperature of the particulate material is above 50° C., 55° C., 60° C., 65° C., 70° C., 75° C., 80° C., 85° C., 90° C., 95° C., 100° C., 105° C., preferably above 110° C., 115° C., 120° C., 125° C., 130° C., 135° C., 140° C., 145° C., 150° C., 155° C., 160° C., 165° C., 170° C., 175° C., 180° C., 185° C., 190° C., 195° C., 200° C., 205° C., 210° C., 215° C., 220° C., 225° C., 230° C., 235° C., 240° C., 245° C., 250° C., 255° C., 260° C., 265° C., 270° C., 275° C., 280° C., 285° C., 290° C., 295° C., 300° C., 305° C., 310° C., 315° C., 320° C., 325° C., 330° C., 335° C., 340° C., 345° C., 350° C., 355° C., 360° C., 365° C., 370° C., 375° C., 380° C., 385° C., 390° C., 395° C. or even above 400° C.

In an embodiment, the forming ensures that said interface segment achieves a mechanical tensile adhesive strength. In an embodiment, the interface segment has a mechanical tensile adhesive strength of above 5 MPa. In an embodiment, the interface segment has a mechanical tensile adhesive strength of between 5 MPa and 100 MPa. In an embodiment, the interface segment has a mechanical tensile adhesive strength of above 10 MPa, above 15 MPa, above 20 MPa, above 25 MPa, above 30 MPa, above 35 MPa, above 40 MPa, above 45 MPa or even above 50 MPa. The tensile adhesive strength of the interface layer is tested using EN 582.

In an embodiment, useful average interface segment lengths are anything from 0.001 mm-1000 mm, 0.001 mm-100 mm, such as at least 0.001 mm, at least 0.002 mm, at least 0.005 mm, at least 0.01 mm, at least 0.02 mm, at least 0.05 mm, at least 0.1 mm, at least 0.2 mm, at least 0.3 mm, at least 0.5 mm, at least 1 mm, at least 2 mm, at least 3 mm, at least 5 mm, at least 6 mm, at least 7 mm, at least 8 mm, at least 9 mm, at least 10 mm, as measured an extrusion in an lengthwise axial direction of the cable.

In an embodiment, the interface segment is not formed by welding. In an embodiment, the interface segment is not formed by laser welding. In an embodiment, the interface segment is not formed by soldering or brazing.

Wires, stranded wires, and strands are used synonymously throughout the application to signify the wires inside the cable, all carrying the same electrical phase. The wires may have any cross-section, shape and size. The cables useful for the invention have a plurality of wires anywhere from two, to several hundreds, such as at least two, at least three, at least four, at least five or at least six. In an embodiment, cables having a single wire may be useful with the invention too.

In an embodiment, the method comprises selecting parameters for a forming step relating to at least temperature, wherein said parameters ensure that said compound does not contaminate said interface segment to reduce its electrical properties and/or mechanical properties. Thereby, not melting or vaporizing said reactive compound is ensured.

In an embodiment, the method comprises selecting parameters for a forming step relating to at least temperature, wherein said parameters ensure that the insulating properties of the cable insulation material is maintained.

In an aspect of the invention, it relates to an interface-forming device for providing an electrically conductive power transmission interface on the end surface of a power cable having at least two separate wires being electrically conductive, the cable further comprising a reactive compound different from the wires for providing further features to the power cable. The apparatus comprises: affixing means and deposition means. The affixing means is/are for providing an end section of said power cable, the end section comprising wires having wire ends, the end section further having said reactive compound. The deposition means is/are connected to said affixing means, the deposition means adapted to bring electrically conductive particulates dispersed in a non-adhering carrier fluid of a different material than said particulates into contact with said end section, successively adding the electrically conductive particulates onto the end section. Thereby, the process can be standardized and eased or even automated for operators, and field joints can be produced more easily according to the invention.

In an embodiment, the affixing means is a fastening system as otherwise described in the specification.

In an embodiment, the device further comprises dispersion means adapted for providing a dispersion of electrically conductive particulates dispersed in a fluid of a different material than said conductive particulates, the dispersion means connected to said deposition means and adapted to feed said deposition means with said dispersion.

By affixing means is meant the part that affixes the device relative to the cable, such as a compression fastening system to be fastened around either wire restrainers, cable insulation, the wires themselves, or a combination of any or all of these.

In an embodiment, the device further has a local enclosure with an outer wall delimiting its contents from an outside environment, the local enclosure attached to said affixing means to be fastened securely around the conductor end section. Inside the local enclosure is the enclosure itself, or, in other words, a work cavity for adding said conductive particles; the previously mentioned deposition means; and a conductor end section when a cable is inserted into said device. Thereby, an isolated environment is achieved. This both serves to protect those working with joining the cables as well as provide a stable environment for the process to occur in, which further serves to reduce material usage and increase work speed and reliability.

In an embodiment, the device further has a movement means located in the outside environment connected to the deposition means, which is located in the local enclosure. This is achieved through a connecting part extending through the outer wall, where the movement means is adapted to move said deposition means along the conductor end surface. Thereby, an automated process is eased for devices with a local enclosure. In an embodiment, the movement means is adapted to move the deposition means in all three spatial dimensions. Thereby, more freedom is ensured for the device, which is enabled to work closer to, or farther from, the cable end.

In an embodiment, the deposition means may be chosen from any of an electroplating means, a cold-spraying means and a laser deposition means. In another embodiment, the deposition means may be chosen from any of an electroplating means and a cold-spraying means.

In an embodiment, it relates to device having a parameter controlling means, adapted to control parameters relating to temperature to ensure the reactive compound remains substantially below a reactive temperature, at which reactive temperature said reactive compound interferes with said successively adding to impede the electrical and/or mechanical properties of said electrically conductive power transmission interface and/or where the reactive compound damages the cable at said reactive temperature. Thereby, an at least substantially non-damaging process is ensured.

In an embodiment, the affixing means has a mounting attachment, where said deposition means is coupled to a corresponding attachment for reversibly attaching to said mounting interface. Thereby, a flexible treatment solution is supplied. The part of the interface forming device with the deposition means can be taken off for inspecting the cable end as well as to mount other tools, such as a needle hammering device, a sander or another deposition means, allowing easy handling.

In an embodiment, the apparatus has two open ends for receiving a cable each, where the successively adding step further comprises successively adding onto both cable end surfaces and building onto these a single interface segment, thereby joining the two cables. The cable ends may be cut in any angle. Conveniently, the cable ends are cut in a bevelled fashion, leaving an angular gap in their junction that can easily be filled, for example perpendicular to the axial direction of the cables by successively adding. In an embodiment, the cables are cut in a V-shape substantially symmetrical over their junction and only partly through. Thereby, the interface segment may be built into this gap.

In an embodiment of the invention, it relates to a method for producing a cable and the cable thus produced having at least two separate wires or sectors being electrically conductive, the cable further comprising a reactive compound different from the wires or sectors for providing further features to the power cable, the cable further comprising a cable end having wire or sector ends and said reactive compound within a distance of 5 mm from the cable end surface, characterised by said cable further comprising an electrically conductive power transmission interface extending from said cable end surface and being integrally formed with said wire or sector ends, where said electrically conductive power transmission interface has a melting point being higher than the melting point of said reactive compound, an electrical resistance below 0.6 $m\Omega mm^2$ as an average among 80% of wires, and a mechanical tensile adhesive strength above 5 MPa. Thereby, a cable is supplied for example allowing easy and effective cable joining with other cables.

In an embodiment, the reactive compound is present within a distance of 1 mm, 2 mm, 3 mm, 4 mm or 5 mm from the cable end surface.

In an aspect of the invention, it relates to an interface-forming apparatus for providing a power transmission interface on a power cable for medium voltage, high voltage, extra high voltage and/or ultra-high voltage transmission. The cable comprises an electrical conductor comprising varnished wires and/or insulated sectors, the conductor comprising a conductor end surface comprising wire ends, the apparatus comprising a device body being mountable onto said cable, characterised by the device body further having one or two of an electrical input and an electrical output, and a material inlet and a material outlet.

Further, the apparatus comprises an interface former attached to said device body being connected to a DC circuit having a positive pole and a negative pole, and/or connected to the material inlet and to said material outlet, the interface-forming device being for forming an interface segment on the conductor end surface, the interface segment having a coherent and conductive body, where the conductor interface is for integrally forming with the wire ends, thus allowing an electrical load carried among the wires and/or insulated sectors of the electrical conductor to pass to the interface segment.

Thereby, the interface segments may be formed on conductor ends. Where applicable, the embodiments mentioned for the process are useful for the apparatus performing the process as well.

In an aspect of the invention, it relates to a power cable with a power transmission interface for medium voltage, high voltage, extra high voltage and/or ultra-high voltage transmission. The cable comprises an electrical conductor comprising varnished wires and/or insulated sectors, a conductor end surface comprising wire ends. The cable is characterised by further comprising an interface segment formed on the conductor end surface, the interface segment having a coherent and conductive body, where the interface segment is integrally formed with the wire ends thus allowing an electrical load carried among the wires and/or insulated sectors of the electrical conductor to pass to the interface segment.

Thereby, a cable is provided where adequate transmission, improved transmission, near perfect transmission, or perfect transmission is achievable through the interface segment. Where applicable, the embodiments mentioned for the process are useful for the cable itself as well.

In the application, interface segment is used interchangeably with electrically conductive power transmission interface.

Cold-Spraying

In an embodiment, the forming technique is cold spraying where the particulate material is deposited onto the cable end surface from a high-pressure chamber having pressures above atmospheric. The material is typically carried by a gas that has been pre-pressurised and heated, and then through a nozzle and onto the cable end. In the deposition chamber or room where the cable end is present, the heightened pressure may be spent. Any type of cold spraying may be used according to the invention. In an embodiment, the invention relates to using a cold spraying device for applying an interface segment onto a cable end surface. Thereby, conventional tooling and machining can be used.

Thereby, a non-thermal process is employed that does not introduce liquid into cables, does not raise the temperature to phase transition of the reactive compound and where effective electrical and mechanical contact is established from the wires and to interface segment.

In an embodiment, low pressure cold spraying is used, supplying a carrier gas having a pressure of between 1 and 10 bar. In an embodiment, low pressure cold spraying is used, supplying a carrier gas having a pressure between 1 and 15 bar. Thereby, a cheap and mobile method is used that can more easily be transported to installation sites.

In an embodiment, high pressure cold spraying is used, supplying a carrier gas having a pressure between 10 and 100 bar. Thereby, a denser interface segment having better electrical and mechanical characteristics is achieved.

In an embodiment, laser assisted cold spraying is used, where a cold spray technique is combined with a laser. The laser allows improved coating quality with improved adhesion characteristics as the ability to melt the coating after or while spraying is enabled.

In an embodiment, pulsed gas dynamic spraying is used, where the process uses oscillating pressure waves. Both gas and powder is heated prior to spraying, leading to a process with higher pressure and temperature. Thereby larger deformation of the sprayed particles and/or the cable end is possible, thereby producing an interface segment of a higher quality.

In an embodiment, vacuum cold spray is used, where the cable end surface is placed in a vacuum container with an internal pressure below atmospheric. This reduces the presence of high pressure areas, or in other words, Shockwaves at the cable end making it possible to deposit very small particles, thereby producing an interface segment of a high quality.

In an embodiment, kinetic metallisation is used, supplying a positive charge to the cable end surface and a negative charge to the sprayed particles. Thereby an improved process results in a higher deposition rate of the sprayed powder.

In an embodiment, said forming is cold-spraying, where said cold-spraying is performed depositing a first conductive material and a second filler material. Thereby, deposition quality is enhanced, especially for low pressure cold spraying. In an embodiment, the method comprises said first conductive material being chosen from a list of: silver, copper, gold, aluminium, brass, magnesium, platinum, molybdenum, tantalum, tungsten, nickel, lead, zinc, tin or even iron, including any type of steel, a ceramic material, or any given combination of these materials. In a preferred embodiment, the conductive material is selected from at least one of: silver, copper and aluminium or any given mixture of the 3 materials.

The second material is selected from a list of: silver, gold, aluminium, copper, magnesium, nickel, platinum, lead, zinc, tin, a polymer material or any given combination of these materials potentially combined with a ceramic. The number of materials selected for the interface is not limited to two. In an embodiment, a plurality of layers or embedded structures may be added onto the cable end surface, where each layer may consist of different materials. In a preferred embodiment, the malleable/filler material is selected from at least one of: silver, zinc and tin.

To any of these two compositions may be added peening material, which is not included to bind to the surface, but to act to press/hammer the rest of the composition more securely against the conductor end, improving mechanical and electrical properties of the interface segment. Some peening material may be buried into the deposited material. Peening material may be chosen from any convenient material, and an advantageous material is aluminium oxide.

In an embodiment, the first layer of a conductive material and a filler material is then treated to expose the first conductive material such as by abrading, cutting, chiseling or by another convenient method. Thereafter, a new conductive layer is deposited onto the end surface, more easily attaching to the filler material than the irregularities of the conductor end surface. Thereby, a simple and cheap interface segment is achieved that also has excellent mechanical and electrical properties.

In an embodiment where parameters are controlled and cold-spraying is used, the parameters further relates to at least one of choice of carrier gas, propeller gas, spray-distance, pressure of the carrier gas, particle shape and size, feedstock composition being a metal and may include ceramics or other materials not being conductive particulates, deposition speed and feed rate of the feedstock and traverse speed of the powder through the nozzle. In an embodiment, the method comprises said cold-spraying being performed by depositing a first conductive material and a filler material.

In an aspect of the invention, it relates to using a cold spraying apparatus for forming a power transmission interface on a power cable having at least two wires and a reactive compound.

Electroplating

In an embodiment, the interface segment is formed through electroplating. Thereby, a non-thermal process is used with a precise deposition of conductive material which may be automated and the interfacing may be performed more quickly. Further, a pure and dense interface segment may be achieved having excellent electrical conductive and mechanical properties.

In embodiments, which may be applied with any type of electroplating such as brush plating or bath plating, the direction of the current may be changed as a step of the forming process. Thereby, deposition contour may be controlled. This may be necessary and/or advantageous in case of removal of undesired dendrites formation gradually formed with the electroplating process. Electrodeposition will generally be located where the current density is highest which cause dendrite growth that gradually intensifies. Changing the electrical direction results in a reverse process of electroplating thus resulting in the dendrites being consumed and thus removed. Alternatively, or additionally, additives may be used in the electroplating to control and/or avoid dendrite formation.

In an embodiment, compatible with any type of electroplating, the conductor interface section is formed with pulse electroplating, whereby certain characteristics of the conductor interface section and the composition and thickness of the deposition may be precisely controlled.

In an embodiment, the interface segment is formed through brush plating. Thereby, the deposition speed is increased, while the deposition area is controlled. Further, brush plating removes the necessity of submerging the conductor end into a plating bath.

Brushes may be of any absorbent material such as having long hairs like a brush and/or consisting of any synthetic or organic type of cloth or sponge.

In an embodiment, the brush plating is performed by a belt brush, a reciprocating brush or a rotary brush. Thereby, the brushing process may be automated and deposition may be controlled and made uniform over the conductor end surface and among cable ends. By reciprocal is meant a back-and-forth motion.

In an embodiment, the interface segment is formed through bath plating. Thereby, the conductor end is submerged in an electrolytic solution depositing onto the surface of the conductor end surface.

In an embodiment, the cable has a first end and a second end, where wires of said first end are electrically connected to each other. Creating an electrical current for electroplating an interface segment onto the second end then comprises the steps of connecting at least one of the wires in the second end with circuit for cathodic contact, connecting a plurality of the wires in the second end with an electroplating solution, and providing anodic contact to the electroplating solution and/or said plurality of wires. Thereby, a convenient method is achieved for forming an interface segment onto a conductor end surface during installation, where cathodic and anodic contact is achieved at the installation site thus being convenient and cheap, while new operation procedures do not need to be created to retain access to previous cable interfaces or provide access from the electrical source.

The at least one wire used for achieving cathodic contact is fastened afterwards preferably ensuring electric connection to the interface segment. Such fastening may be performed through any conventional method such as welding, soldering, brazing or using setscrews or bolts.

In an embodiment, two areas of the conductor end surface are housed in an interface-forming apparatus, where the first half provides cathodic contact while the second end provides contact by an anode and an electroplating solution. The first area may be the wire ends and the second end the conductor core, whereby the interface segment may be formed onto the wire ends in a simple process requiring no distant second point of contact to provide cathodic contact.

Alternatively, the wire ends may be divided in any other way among the first and second area, such as half of the wires in the first area and half the wires in the second end. After an interface segment has been formed onto the first area, the process may be reversed, and a second interface segment may thus be formed onto the second area of the conductor end surface.

In an embodiment, power is instead provided from the electrical source or at least through two whole cable segments. In an embodiment, during installation of cables, consecutive cables are tested for conductivity for each individual/all individual wires.

By electroplating, the quality of each consecutive interfacing may be assessed continually during installation. Thereby, weak interfacings may be identified prior to burying, submerging or leaving the cables thus reducing risk of poor installations and consecutively avoiding expensive repairs.

Laser Metal Deposition

In an embodiment, the interface segment is formed by laser metal deposition. This may be performed by laser cladding where a powder is sprayed into a laser melt-zone and deposited onto the cable end surface in at least a partially liquid state; or by depositing a shallow metal layer onto the cable end surface prior to being melted; or in a combination with cold-spray deposited material.

In an embodiment where the interface segment is formed by laser, a pre-treatment is carried out where a laser evaporates the reactive compound in at least an outer part of the end section, such as at least 0.000001 mm, at least 0.00001 mm, at least 0.0001 mm, at least 0.0005 mm, at least 0.001 mm, at least 0.005 mm, at least 0.01 mm, at least 0.02 mm, at least 0.05 mm, at least 0.1 mm, at least 0.2 mm, at least 0.3 mm at least 0.5 mm, at least 1 mm, at least 2 mm, at least 3 mm or even at least 5 mm into the cable from the cable end in a direction parallel with the direction of the cable prior to or while forming the interface layer.

In an embodiment, said forming is laser metal deposition, where said laser deposition is performed depositing a first conductive material with lower melting point creating a sealing barrier to the reactive compound and subsequently a second conductive material. Thereby, deposition quality is enhanced by avoiding or reducing thermal effects affecting the reactive compound, thus higher temperatures may be used during deposition of said second conductive material. In an embodiment, the method comprises said first material being chosen from a list of silver, copper, gold, aluminium, brass, magnesium, platinum, molybdenum, tantalum, tungsten, nickel, lead, zinc, tin or even iron, including any type of alloy, steel, or any given combination of these materials, and the second material is selected from a list of silver, gold, aluminium, copper, magnesium, nickel, platinum, lead, zinc, tin or any given combination of these materials. The number of materials selected for the interface is not limited to two. In an embodiment, a plurality of layers or embedded structures may be added onto the cable end surface, where each layer may consist of different materials.

Pre-Treatment

In an embodiment, the method further comprises a pre-treatment step, said pre-treatment comprising using laser to remove said reactive compound in at least an outer part of said cable end, such as in the outer 0.005 mm, prior to successively adding said particulate matter onto the cable end. Thereby, higher temperatures may be used during successive adding said particulate matter without affecting the reactive compound.

In an embodiment where the interface segment is formed by laser, a pre-treatment is carried out where a laser evaporates the reactive compound in at least an outer part of the end section, such as at least 0.000001 mm, at least 0.00001 mm, at least 0.0001 mm, at least 0.0005 mm, at least 0.001 mm, at least 0.005 mm, at least 0.01 mm, at least 0.02 mm, at least 0.05 mm, at least 0.1 mm, at least 0.2 mm, at least 0.3 mm at least 0.5 mm, at least 1 mm, at least 2 mm, at least 3 mm or even at least 5 mm into the cable from the cable end in a direction parallel with the direction of the cable prior to or while forming the interface layer.

The pre-treatment may otherwise or additionally include heat treatment, cutting, milling, grinding, polishing, abrasive blasting, blowing with pressurized gas, other electromagnetic treatment, solvent cleaning, hot alkaline detergent cleaning, cleaning it with other chemical compounds, electro-cleaning and/or acid treatment. In an embodiment, the cleaning process is performed while successively adding and/or after successively adding. The pre-treatment as carried out with laser has synergy with successively adding with laser, but may be used with any technique for adding the material of the interface segment.

In an embodiment, providing the conductor end surface comprises attaching a ferrule around the wires of the conductor and hydraulically crimping or mechanically fixating the ferrule, providing mechanical integrity to the cable end.

In an embodiment, the conductor end surface is treated to reduce the potential gab clearance between wires and/or sectors after forming the conductor end surface and prior to forming the interface segment and may include plastic deformation of the wire end surface through rolling, use of scaling tools, and/or peening such as shot peening, hammer peening, ultrasonic peening and/or high frequency impact treatment.

In an embodiment, the conductor end surface is treated to enlarge the exposed end surface area, allowing for an improved mechanical interlocking of the subsequent formed interface segment. The enlarged surface area can be shaped as a pattern of small mountains, hooks, spikes or any oddly structural shape created as a result of any combination of the pre-treatment techniques. Thereby the tensile adhesive strength of the interface segment can be improved.

In an embodiment, the reactive compound is treated by a chemically reducing gas where the chemical reaction is driven without supply of external energy.

In an embodiment, the wire ends in the cable are excited with high frequency vibration creating relative motion between wires, such that an abrasive wear removes, loosen or break the reactive compound into smaller parts that are more easily removed prior to forming the interface segment.

In an embodiment, the pre-treatment process is carried out in a combination of different pre-treatment steps. The steps are carried out in a preferred manner relative to the effectiveness of removing the reactive compound and the ability to leave a quality of the end surface advantageously for later forming of the interface segment.

In an embodiment, any of the mentioned pre-treatments may be used as an intermediate treatment between steps of adding material on the end of the cable end.

Post Treatment

In an aspect of the invention, it relates to a sleeve for joining a power cable to an electrical interface being a power cable or a cable termination, the sleeve comprising: a sleeve body forming at least one socket for receiving a cable further having a conductive channel from a socket to said electrical interface, characterised by further comprising a conduit inside the at least one socket being conductive and displaceable relative to the body having a surface facing out of said socket for abutting an interface segment of an inserted cable, and a compression fastener allowing fastening said conduit against said interface segment by applying and maintaining an axial force on the conduit towards the cable relative to the sleeve body, and where said conduit is in electrical connection with said sleeve body directly and/or through said compression fastener, whereby a current may flow from said cable to the interface segment, then over said conduit, into said body and to said electrical interface. Thereby, an improved sleeve is supplied that takes advantage of the structure of the interface segment of the invention.

In an embodiment, the end surface of the interface layer is further abraded or cut to improve it for further processing. Thereby, for example uneven deposition of different materials or processes is remedied. In an embodiment, after the filler material has been deposited, a layer of conductive material is added onto the end surface of the interface layer to interact integrally with the deposited conductive material. Thereby, a significantly better electrical connection may be achieved, for example for low pressure cold spraying techniques.

In an embodiment, the method further comprises a step of compacting, where the conductor end surface or the interface layer is further subjected to mechanical stress, improving its mechanical and/or electrical characteristics. This may for example be by needle hammering. Thereby, increased adhesion strength and decreased contact resistance between wires and the interface segment is achieved, while increasing mechanical strength as well as the electrical conductivity in the interface. In an embodiment, the post-treatment is performed through use of a cold rolling technique, hammering using a small hammer or pneumatic, hydraulic driven needle scaler, peening or high frequency impact treatment.

In an embodiment, the conductor end surface or the interface segment is heat treated using a laser or other heat sources. In an embodiment, the interface segment formed by any type of cold-spraying is post-treated by influencing the formed interface. In an embodiment, any of the mentioned post treatments may be used as an intermediate treatment between steps of adding material on the end of the cable end; as a pre-treatment step; or as a concurrent step, taking place while depositing material.

Electrical Resistance of the Interface Segment

By forming an interface segment according to the invention, an effective joining or termination may be achieved. In an embodiment, by providing an interface segment according to the invention, a connection is provided that has an average specific electrical contact resistance of less than 500 thousands of an ohm square millimetre, less than 400 m$\Omega$mm$^2$, less than 300 m$\Omega$mm$^2$, less than 200 m$\Omega$mm$^2$, less than 100 m$\Omega$mm$^2$, less than 50 m$\Omega$mm$^2$, less than 40 m$\Omega$mm$^2$, less than 30 m$\Omega$mm$^2$, less than 20 m$\Omega$mm$^2$, less than 15 m$\Omega$mm$^2$, less than 14 m$\Omega$mm$^2$, less than 13 m$\Omega$mm$^2$ less than 12 m$\Omega$mm$^2$, less than 11 m$\Omega$mm$^2$, less than 10 m$\Omega$mm$^2$, less than 9 m$\Omega$mm$^2$, less than 8 m$\Omega$mm$^2$, less than 7 m$\Omega$mm$^2$, less than 6 m$\Omega$mm$^2$, less than 5 m$\Omega$mm$^2$, less than 4 m$\Omega$mm$^2$, less than 3 m$\Omega$mm$^2$, less than 2 m$\Omega$mm$^2$, less than 1 m$\Omega$mm$^2$, less than 0.9 m$\Omega$mm$^2$, less than 0.8 m$\Omega$mm$^2$, less than 0.7 m$\Omega$mm$^2$, or even less than 0.6 m$\Omega$mm$^2$.

Measuring the resistance may be performed by providing the interface segment with a thickness of 5 mm on a first end of a cable sample having a length of 1 metre. Then the electrical resistance is measured over the interface segment from one wire at a time on a 1 metre cable sample using a 4-point measurement technique. This is done by connecting to the interface segment and to individual wires of the cable of a second opposing wire end 1 metre from the first wire end. The contact resistance connecting the measuring circuit and electrical resistance of the measuring circuit and the connected wire is subtracted from the measurement. The specific electrical contact resistance is calculated using the measured resistance multiplied with the cross-section area of the connected wire.

For measuring the electrical resistance over the interface segment, an average is taken among at least 80%, at least 85%, at least 90%, at least 91%, at least 92%, at least 93%, at least 94%, at least 95%, at least 96%, at least 97%, at least 97.5%, at least at least 98%, at least 98.25%, at least 98.5%, at least 98.75%, at least 99%, at least 99.1%, at least 99.2%, at least 99.3%, at least 99.4%, at least 99.5%, at least 99.6%, at least 99.7%, at least 99.8%, at least 99.9%, at least 99.95% or even 100% of wires of the cable that the interface segment is fastened to.

SHORT LIST OF DRAWINGS

Figure 4:
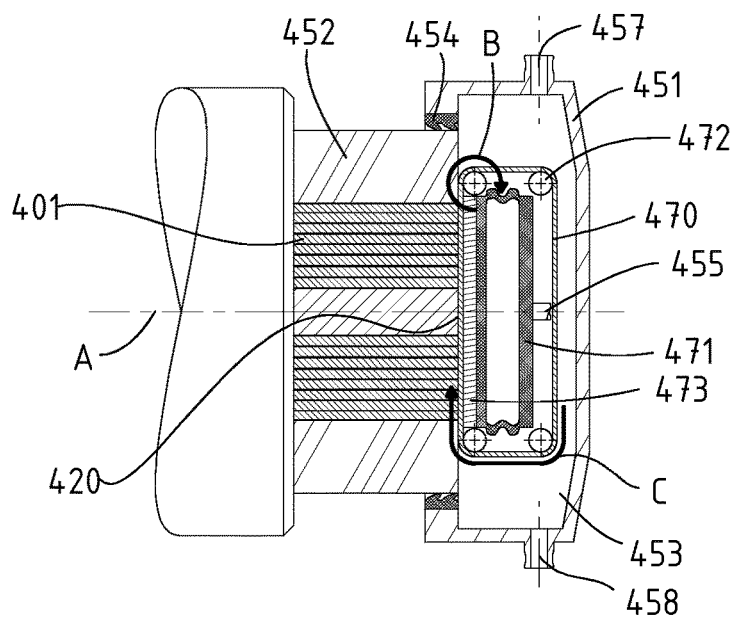
Figure 5:
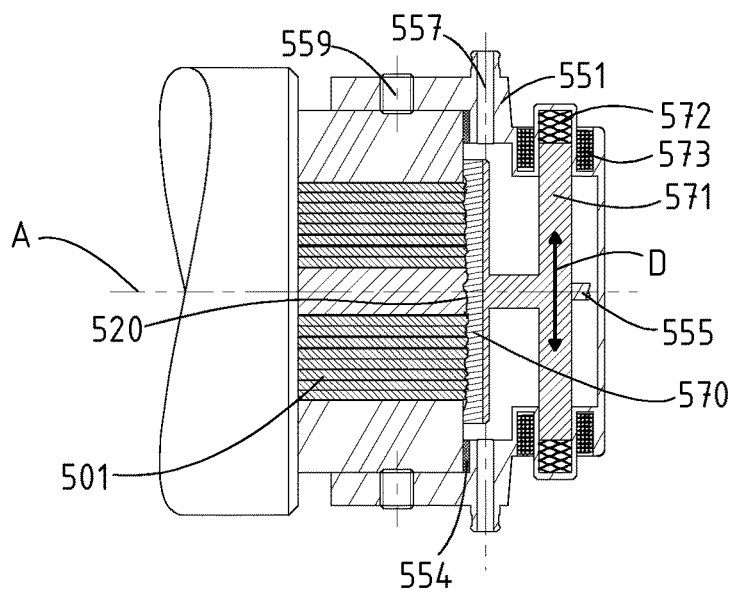
Figure 6:
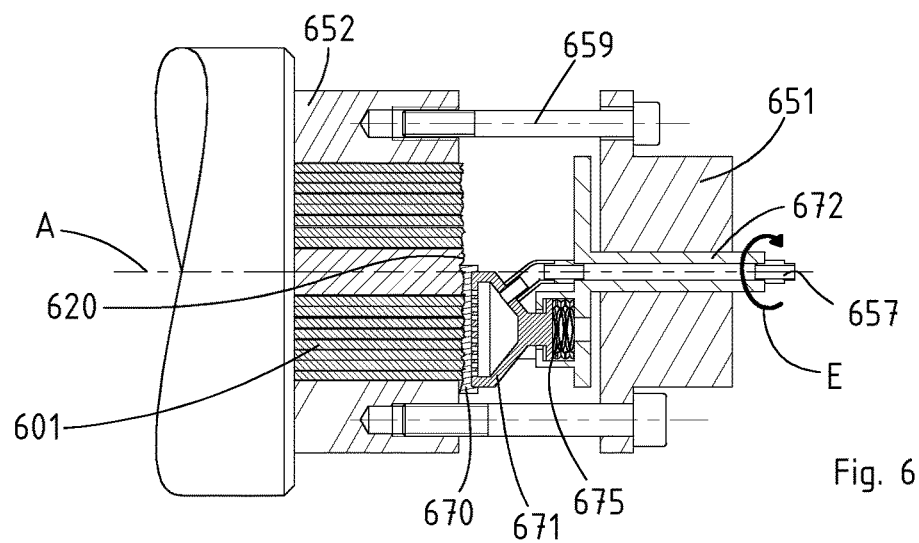
Figure 7:
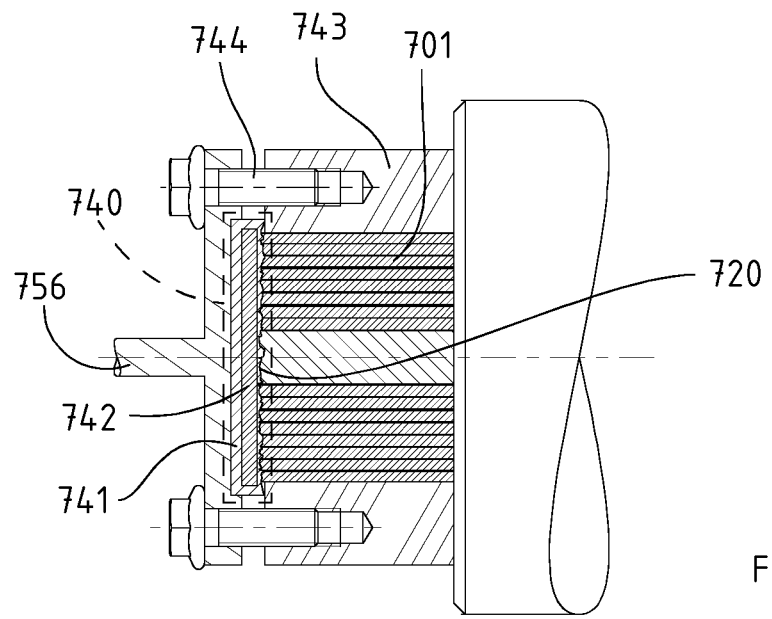
Figure 8:
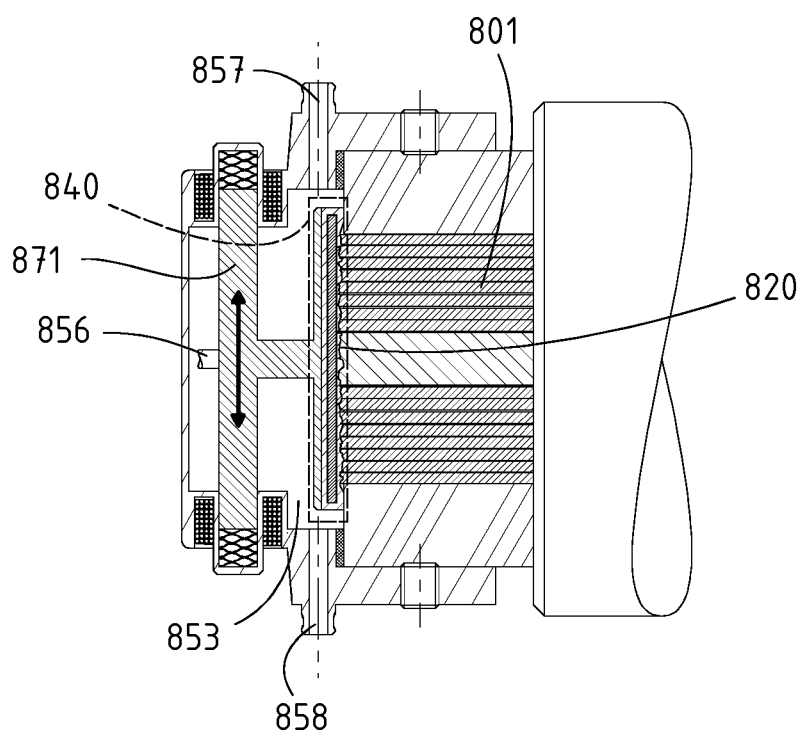
Figure 9:
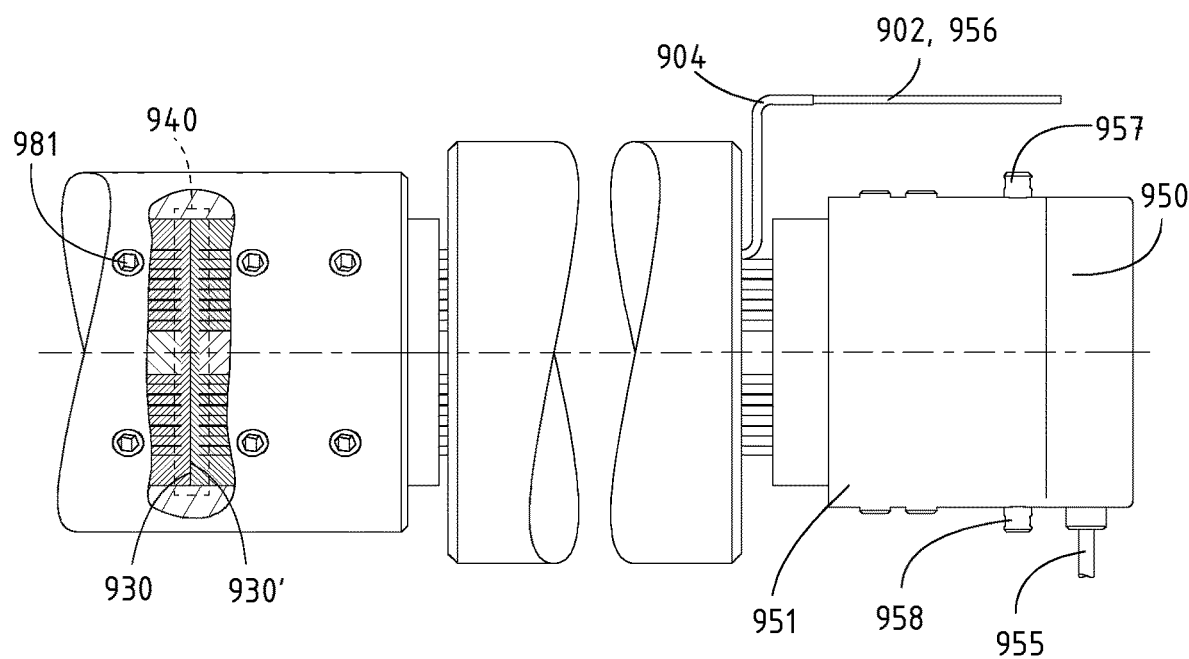
Figure 10:
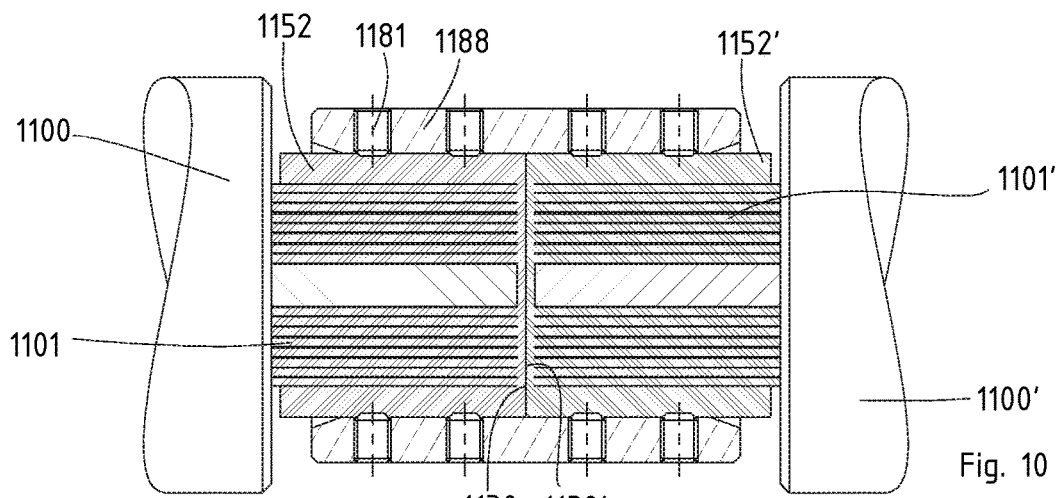
Figure 11:
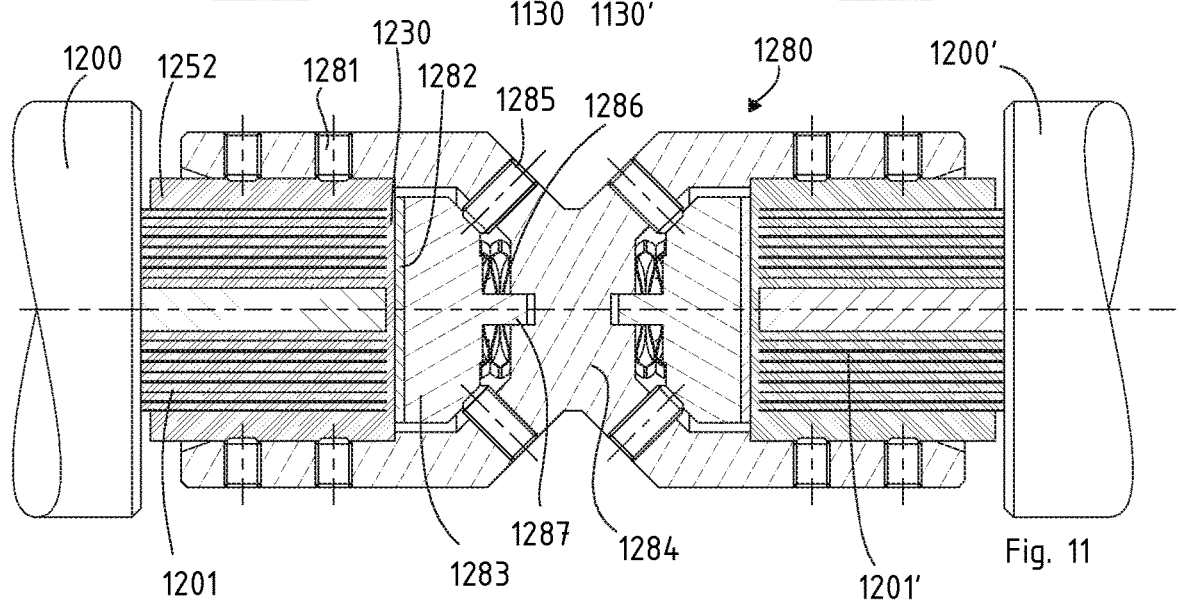
Figure 12:
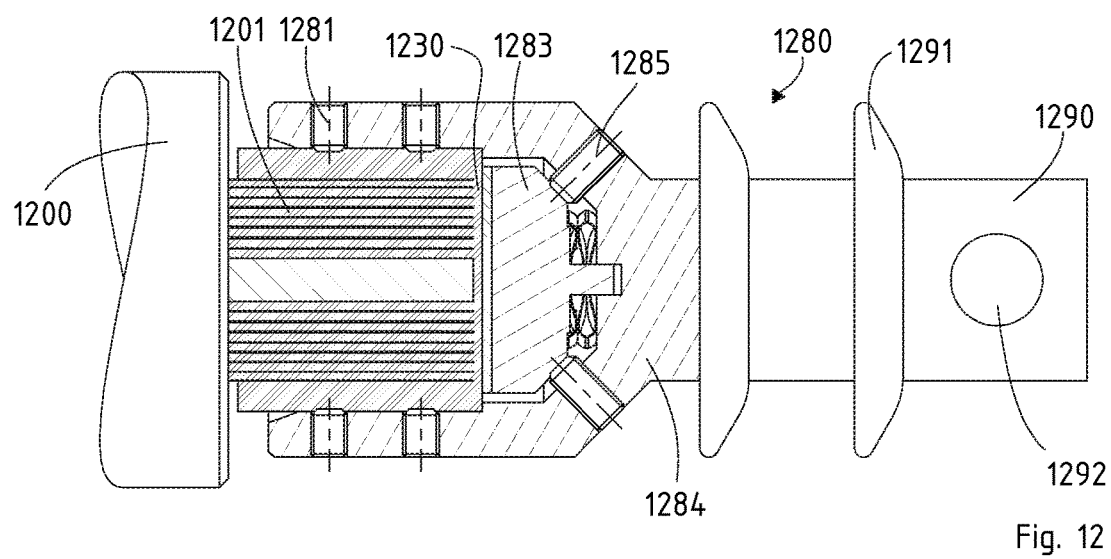
Figure 13J:
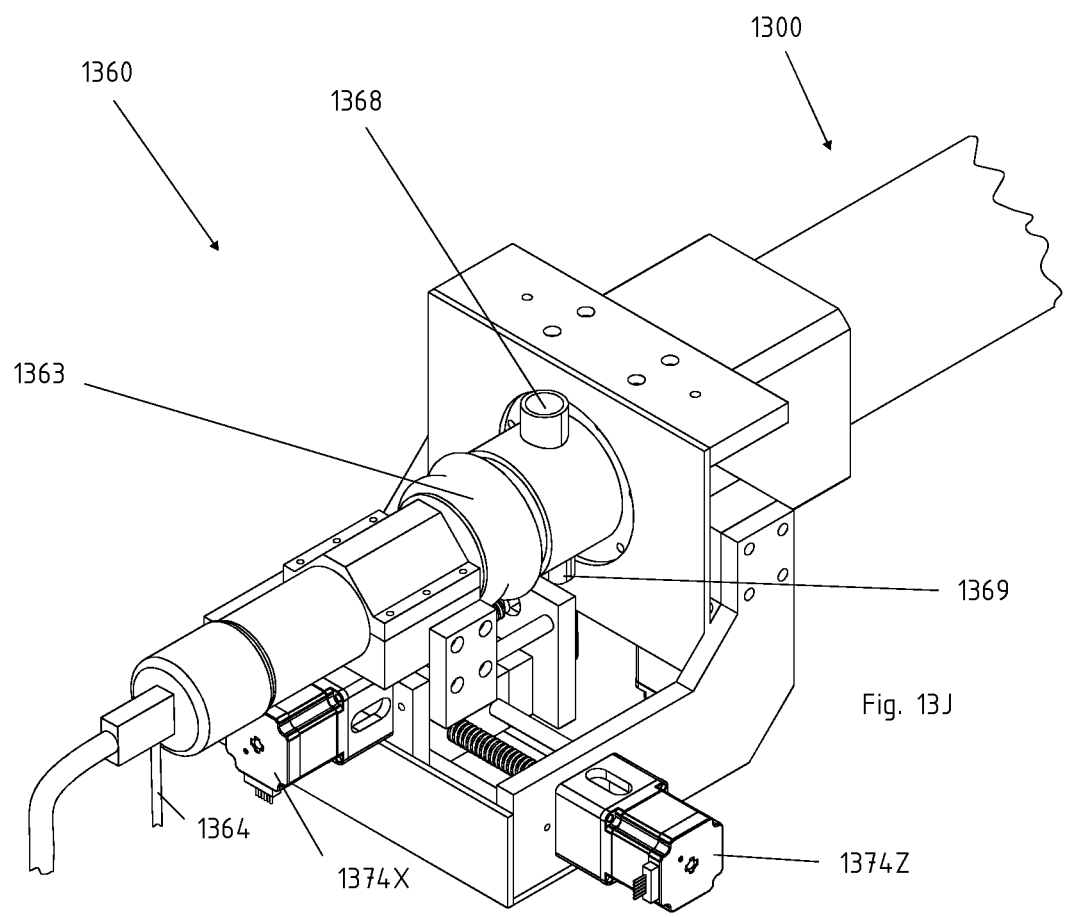
Figure 13K:
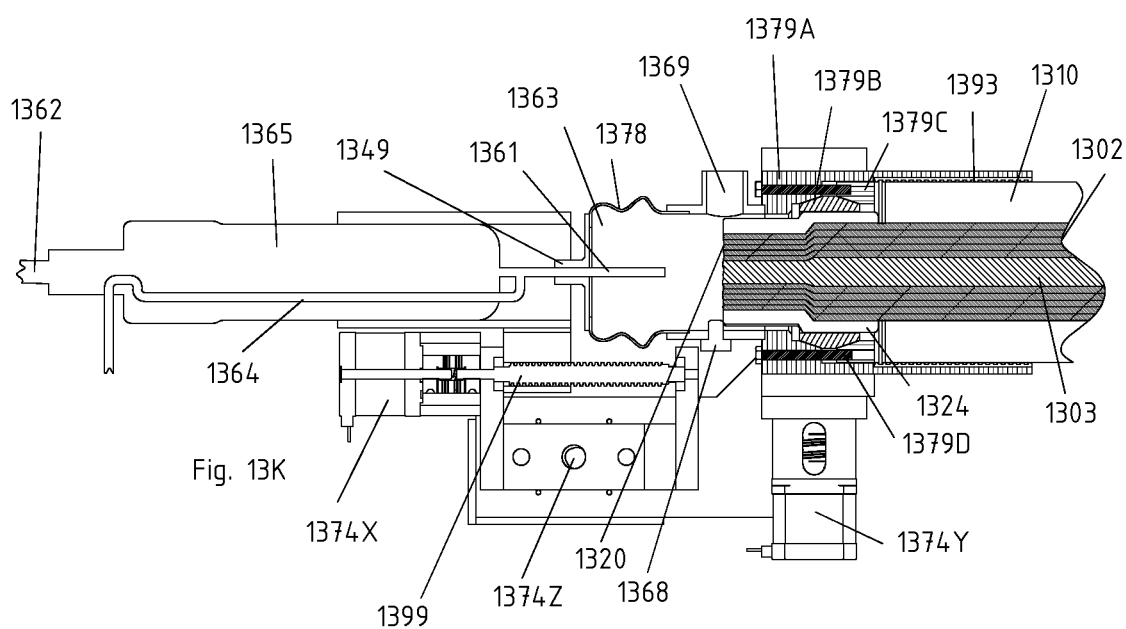
Figure 18:
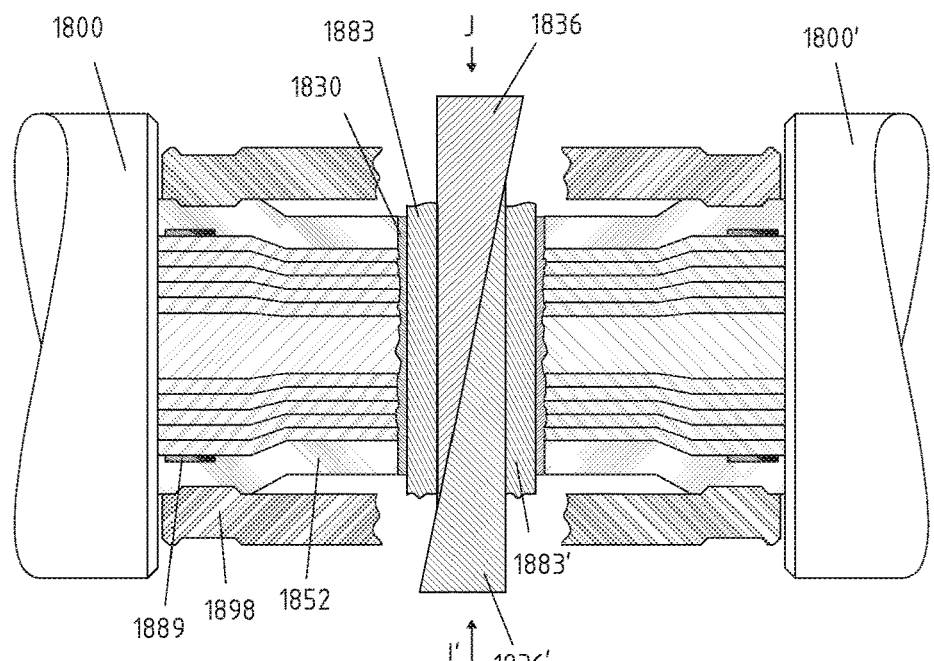

In the following, example embodiments are described according to the invention, where FIG. 1A is a front view of a power cable according to the invention, FIG. 1B is a cross-sectional view of a power cable according to the invention, FIG. 2A is a front view of an interface segment on a power cable according to the invention, FIG. 2B is a cross-sectional view of an interface segment on a power cable according to the invention, FIG. 2C illustrates a layered interface segment on a power cable according to the invention, FIG. 3 illustrates a principal embodiment of an interface-forming apparatus using electroplating according to the invention, FIG. 4 illustrates a belt brush plating device according to the invention, FIG. 5 illustrates a reciprocating brush plating device according to the invention, FIG. 6 illustrates a rotary brush plating device according to the invention, FIG. 7 illustrated providing cathodic contact according to the invention, FIG. 8 illustrates an alternative cathodic contact according to the invention, FIG. 9 illustrates an electroplating method for cable installation according to the invention, FIG. 10 illustrates power cable joining using a sleeve according to the invention, FIG. 11 illustrates power cable joining using a socketed sleeve according to the invention, FIG. 12 illustrates termination of a power cable according to the invention, FIG. 13A-13C illustrate using cold-spraying according to the invention, FIG. 13D-13H illustrate various cold-spraying method steps, FIG. 13I-FIG. 13K illustrate a cold-spraying device according to the invention, FIG. 14 illustrate using laser metal deposition according to the invention, FIG. 15 illustrates a spiked conduit for attaching to the interface segment according to the invention, FIG. 16 illustrates a curved interface segment, FIG. 17 illustrate flanged end plates, FIG. 18 illustrates a wedge expansion element for joining cables, and FIG. 19 illustrates a spring-loaded element for joining cables.

GENERAL DESCRIPTION

In the following, the invention is described in detail through embodiments thereof that should not be thought of as limiting to the scope of the invention. Most of the discussed embodiments relate to varnish and/or insulated sectors, which are example reactive compounds.

FIGS. 1A and 1B are a front view and a cross-sectional side view, respectively, of a Milliken type power cable 100 readied for forming an interface segment. In general, the cable has a conductor 101 and protective layers 110 around the conductor 101. For the purposes of the invention, the semi-conductive layer 112, the sheath 113, the secondary protection layer 114 and the outmost protection layer 115 providing generally electrical and mechanical insulation and sheathing are mostly uninteresting in relation to this invention. The insulating layer 111 will be of interest.

The conductor comprises a plurality of sectors 106 separated by insulating paper 105 and a plurality of stranded wires 102 within each sector 106. In the shown embodiment, the conductor comprises six sectors each having sixty stranded wires. A plurality of the stranded wires have varnishes 104 layer isolating the wires from one another thus resulting in a reduced skin effect and proximity effect. The centre core 103 also prevents wires 102 from entering the strong magnetic field generated by the AC current at the cable centre and by the same logic, the centre is typically not meant to carry a current. The centre core 103 may be composed by a different material than the wires 102.

In FIG. 1B, the protective layers 110 have been removed for an end section of the cable, and the conductor 101 has also been cut, sawed or otherwise brought to an exposed end. This process is typically performed by cutting the entire cable and then in a subsequent step, by removing the protective layers 110 for the end section. Ending a stranded conductor produces an irregular conductor end surface 120 with individual wire ends 122 of slightly varying lengths and surface roughness. The resultant unevenness of the conductor end surface 120 depends on the procedure and tool for cutting the cable in production or at installation site.

FIGS. 2A and 2B illustrate a front view and a cross-sectional side view, respectively, of a Milliken type power cable after an interface segment 230 has been formed on the conductor end surface 120 electrically connecting the wires 202 in the cable conductor 101 through the interface segment 230. By integrally forming an interface segment 230 onto the irregular end surface of the conductor, a connection is established to stranded wires. This connection ensures that electrical and mechanical contact is achieved between the stranded wire ends in the conductor 101 and the interface segment 230. In addition, the properties of the contact provide a connection without any significant contact resistance, essentially without contact resistance or completely without contact resistance. The connection is further mechanically strong and durable overtime relative to the thickness of the interface segment. Thus, the connection type is useful for several applications such as conductor testing, conductor production, cable termination and joining of cables during installation. Furthermore, the connection allows choice of varnish type to be primarily focused on compliance to achieve optimal electrical and mechanical requirements with few or no drawbacks, and requires no focus on easy removable varnish.

The material of the interface segment 230 is advantageously the same material as the wires 102, typically copper or aluminium. Thereby, little or no electrode potential will arise thus avoiding galvanic corrosion in the presence of an electrolyte. The result is thus a better lifetime of the interface. In other embodiments, the conductor segment 230 may be of any electrically conducting material. Advantageous materials are gold, silver, copper, tin, aluminium, or an alloy comprised by any of the said elements.

The interface segment 230 may be formed after applying a crimp connector to the cable end. The crimp connector may be characterised by a permanent element in the form of a connecting ferrule or a temporary connection device.

By thus providing an interface segment 230, which connects integrally with each wire end 202 of the conductor and provides electrical contact, an interface is provided for use in joining the cable to like cables, other cables or to other devices such as for precise testing of cable properties, and cable termination of any other kinds.

The interface segment 230 may consist of one or more layers as represented in FIG. 2C with multiple interface segment layers 231, 231', 231" applied to the interface segment 230 or the cable end surface. Through multiple layers, it is possible to obtain various desirable mechanical, electrical and/or material properties. If the contact resistance between an independent adjacent item and the interface segment 230 applied to the cable end is at an undesirable level due to oxidation of the connecting material surfaces, contact resistance may be enhanced by applying a thin coating of gold or silver. Such materials possess some advantageous properties in a contact interface as metal oxide is less likely on noble metals given a larger set of operating conditions, including temperature and pressure. Gold does e.g. generally not form any oxide layer or tarnish in general under normal operating conditions of power cables described by an Ellingham diagram. Another need is characterised when the base metal of the wire 102 is made from a specific material which only adheres to a limited number of materials. In this case, the interface segment 230 must be built of multiple layers 231 as to end up with a desired end surface of a specific material with necessary properties hereunder hardness, corrosion resistance, electrical conductivity and mechanical strength.

FIG. 3 is a principal embodiment of an interface-forming apparatus for applying an interface segment 230 and/or interface segments 231, 231' onto the irregular cable end surface by using an interface former 350.

To prevent the stranded wires and sectors of the compact-formed cable from deflection in a radial direction relative to the cable direction, when the protective layers 110 are removed, a wire restrainer 352 may conveniently be used to fixate the stranded wires 302 in either or both ends of the cable thus ensuring a stable and fixed conductor end surface for further treatment. This wire restrainer 352 may be electrically conductive and may further be formed in the same material as the wires, such as copper, aluminium or a steel alloy. The wire restrainer 352 may be a mechanical clamping device, ferrule, a mechanical connector such as a crimp connector and/or shear bolt connector, or even certain layers of the protective layers 110 such as the insulating layer 111.

After the wire restrainer 352 has been applied on the cable conductor 301, further preparation of the conductor end surface can be carried out to prepare the conductor end for forming of the interface segment 230, such as cutting, milling, grinding, polishing, abrasive blasting, blowing with pressurized gas, other electromagnetic treatment such as using laser, solvent cleaning, hot alkaline detergent cleaning, cleaning it with other chemical compounds, electro-cleaning and/or acid treatment. This may be advantageous to improve the mechanical and chemical adhesion of the interface segment further. For example, most conductor materials will oxidise in atmospheric air, and removing the oxide layer prior to forming the conductor interface segment may then improve the electrical connection.

The interface-forming apparatus has a device body 351 and thereby fixates the interface former 350 relative to the conductor end surface when the device body 351 is mounted onto the conductor end surface. The device body 351 may further provide a fluid seal to improve safety and material control and efficiency. The device body 351 may take the shape of a housing having an inner chamber 353.

The interface former 350 may further be connected to a DC terminal 355 or 356 positive or negative supplied by DC power supply not illustrated in the figure, whereby the forming process may be completely automated. Further, depending on technique used to form the interface, the interface former 350 is further provided with a material inlet 357 and/or a material outlet 358.

FIGS. 4, 5 and 6 illustrate embodiments of the invention, where the interface-forming apparatus forms the interface segment 230 onto the conductor end surface 220 by electroplating, more specifically brush plating. Thus, the interface former x50 takes the shape of various types of brushes and other needed features such as electrodes.

Looking first at FIG. 4, we see a conductor end surface 420 of a conductor 401. In the opposite end of the cable, cathodic contact is provided to all wires, the method of this being described below. The distance between the ends varies with application and may for example be one metre or ten metres for conductor testing or 500 metres for installation or any other convenient length.

In proximity of the conductor end surface 420 to be brush plated, the wire restrainer 452 fixates the conductor 401. A device body 451 is mounted to the wire restrainer 452. A sealing mechanism 454 may partially or fully prevent fluids from escaping the device body 451 which is shaped here as a housing having a chamber 453. The sealing mechanism 454 may have a gasket. Inside the housing, a rotary motion B of wheels 472 drives a belt brush 470 along a path C. A spring electrode acts as Dimensional Stable Anode (DSA) during deposition. The spring is compressible along axis A and carries a positive charge during the material deposition process forming the anode of the electroplating process. The spring electrode 471 presses against a sponge element 473 which in turn presses against the deposition means/belt brush 470 which is thus pressed against the conductor end surface 420. The spring electrode 471 is connected to the positive DC terminal 455 thus enabling current to flow, as a result of the presence of an electrolyte connecting the spring electrode 471 and the conductor end 420, in the complete electrical circuit over the negative and positive poles of the DC power supply (not shown in the figure). The sponge element 473 may be of any material that is compressible and absorbent and should advantageously press against the belt brush 470. However, material must be chosen thus not reacting with the electrolyte or any other substances in its presence.

A plating solution is introduced to the chamber 453 through the material inlet 457 thus connecting the device body with any convenient fluid systems such as a reservoir of fresh and/or reusable plating solution. The plating solution is applied to the belt brush 470 and/or the sponge element 473. The circuit carries a charge with the conductor end 420 acting as a cathode, a plating solution is applied to the belt brush 470 and/or sponge element 473, and material deposition onto the cable end 420 is ensured. During operation, plating solution drips and/or runs into the bottom of the chamber 453, and it can be removed through material outlet 458 connectable to any convenient external fluid systems such as filters and the aforementioned solution reservoir, thereby reusing the solution.

To increase the deposition speed of brush plating generally, a stirring, agitation or abrasive action can be applied and increased thus reducing the diffusion layer thickness in the electroplating process. For the invention, this is advantageously achieved simply by using a moving brush such as the mentioned belt brush 470. The continuous movement C of the belt brush 470 creates an aggressive agitation of the plating solution near the conductor end surface 420 thus reducing the diffusion layer thickness significantly. In an embodiment, is important that the plating solution can penetrate the belt brush 470 without filtration effects on the plating solution.

Advantageously. the sponge element 473 absorbs liquids through capillary forces thus creating electrolyte reservoir thus ensuring a stable deposit of material onto the cable end surface thus forming the interface layer.

The embodiment illustrated in FIG. 5 uses brush plating and works principally in a fashion similar to the embodiment of FIG. 4. The cable end 520 becomes a cathode, while an electrode 571 acts as an anode. The anode is dimensional stable through careful material selection. Plating solution is introduced onto the reciprocal brush 570 and is allowed to leave the device housing after use. The device housing 551 can be fixated on the wire restrainer through setscrews 559.

Reciprocal motion D of electrode 571 works through a deposition means/reciprocal brush 570 onto the conductor end surface 520. The motion may be obtained by pull-type linear solenoid construction. Pulsating current flow through a solenoid system 573 combined with the return spring 572 attached to the electrode 571 creates the reciprocal motion. One advantage of such a system is that all moving parts may be contained inside the housing, while all the electronics controlling the device, which are vulnerable in a hazardous chemical environment, are kept outside the housing.

FIG. 6 illustrates an embodiment in accordance with the invention, where the device body 651 is not shaped as a housing with an inner chamber, but where the deposition is still performed through brush plating. In the embodiment shown, the plating solution enters through material inlet 657 and spills into a reservoir underneath the interface-forming apparatus after use. The plating solution is absorbed by the rotary brush 670 and applied to the conductor end surface 620. The deposition means/rotary brush 670 is attached to the electrode 671 which is attached offset from a rotating rod 672 rotating by motion E. Rotating rod 672 is preferably conductive and connected to a DC polarity and is electrically connected to electrode 671. Again, electrical contact closing the loop between the anode and the cathode allowing current to flow in the circuit is established only by the presence of the plating solution.

Rotation of the electrode 671 relative to the conductor surface 620 is avoided thus ensuring a uniform velocity profile between the rotary brush 670 and the conductor surface 620. The uniform velocity profile is important in order to ensure a constant cathodic diffusion layer thickness over the entire cable surface thus ensuring an even material deposition.

The rotary brush may have a circular surface area, a rectangular surface area or even a circle-sector surface area or any other geometric shape being convenient. The rotating brush may have an area enclosing any percentage of the cable cross-sectional area. The rotating brush is restrained to traverse a distance that is equal over all points on the cable end 620 thereby ensuring an even and equal duration on all points of the cable end. This results in an even thickness of the deposited material throughout the end surface. The built interface segment 260 may then have a uniform thickness.

Besides the flexibility obtained through the rotary brush 670 adapting its shape towards the varying contour of the conductor surface 620, the spring system 675 ensures that constant pressure is applied onto the conductor surface 620. This prevents non-contacting areas and accommodates building material onto a gradually nearer surface as the interface segment begins forming without damaging the brush.

The device body 651 is fixed relative to the conductor surface 652 through fasteners 659 on the wire restrainer 652.

In the embodiments shown in FIGS. 4-6, brush plating is used. By using brush plating, the deposition speed is enhanced which increases cable joining speed and cable testing speed significantly compared to traditional plating methods. Compared to other electroplating techniques, brush plating is fast thus making it suited for cable testing, assembly and installation. In other embodiments of the invention, any other electroplating processes may be used, such as submerging a conductor end in an electrochemical bath with a suitable anode, such as rods or plates (hereafter bath plating). The anode may be any suitable DSA material. This submerging may be performed in the described device bodies having chambers, or it may be in a vertical setup. Thereby, the process becomes a simple process with few steps and using cheap components however with a slower deposition rate.

FIGS. 7 and 8 illustrate embodiments of providing the wires of a cable to be cathodic for the electroplating process. By connecting all wires in the conductor 701 to the negative polarity of the DC power supply, electroplating may commence by simultaneously providing a positive electrical polarity to the DSA in the opposite end of the cable where the interface segment is being formed (not shown). Because the electroplating process requires only a small current to pass over the cable compared to the current passing over the cable after installation, the required electrical connection may be of various types not useful for installation, testing and/or production.

In the embodiment shown in FIG. 7, electrical connection is ensured to the wire ends of the conductor end 720 by an elastic electrode 740 being mounted against the conductor end 720. The elastic electrode 740 may be an elastomer element 742 with a sheet of conductive foil 741 wrapped around it. The foil may for example be of aluminium or copper. The elastic electrode 740 is then held in place by fixating it against the cable end 720 through any convenient method such as being held by a negative DC terminal 756 shaped to hold against it and fastened to the cable with fasteners 744 being for example bolts or screws mounted in the wire restrainer 743. The electrical carrier 756 is connected to the negative polarity of the DC power supply leaving the elastic electrode 740 with a resulting negative polarity.

The elastic electrode 740 may take any shape that allows deformation over an area, while a charge is also allowed to pass over the area. An alternative embodiment would be a plurality of small conductive springs oriented against the conductor end surface 720, the springs then mounted on an electrical output 756, where the number of springs matches or exceeds the number of wires in the conductor. The elastic electrode 740 may also be made of a metal rubber type material or a combination of materials.

FIG. 8 illustrates an alternative embodiment, wherein an interface-forming apparatus is further mounted onto the second end of a cable. The purpose is now to establish electrical connection to all wires in the conductor 801 by exchanging the reciprocating brush for an elastic electrode 840. The exchange of reciprocal brush to an elastic electrode 840 may be performed in an automated manner, thus switching from interface forming to providing cathodic contact.

By switching the direction of the current, material can be deposited on either end of the cable. This further requires switching electrode contact material from a brush to an elastic conductive element. The apparatus mounted in both cable ends are similar. An electrical pathway from negative DC terminal 856 to an electrode 871 to an elastic electrode 840 makes electrical connection to the conductor end surface 820 with its varying contour. When the reciprocating brush has been exchanged with an elastic electrode 840, plating solution is not applied to or present in the chamber 853, whereby degradation of the cable end does not occur. Any brush type may be used.

FIG. 9 illustrates an apparatus enabling a mobile and flexible power transmission system for providing anodic and cathodic contact for electroplating an interface segment useful when installing cables.

Normally, only one cable end can be prepared at production site before shipment because cable length will be adapted and fitted at installation site before installation thus resulting in cutting of one end of the cable end. Therefore, the opposite end is conveniently treated on site.

Further, as distance between the cable ends increase during installation of the cable due to joining of several cable segments—such as through joining of conductors having interface segments 930, 930'—the distance between the cathodic contact point and the anodic contact point increases.

An advantageous alternative is illustrated in FIG. 9. After an interface layer 930 has been applied in a first conductor end, it is possible to obtain full electrical contact to all wires in the conductor from a second opposite end of the conductor by as little as one of the wires 902, whereby the wire acts as a DC polarity connection 956 to all wires in the conductor. The varnish 904 of the extracted one or more wires 902 is conveniently removed. Thereby, once the cable has been cut to the right length, the electroplating process may be carried out in a couple of ways.

By extracting one or multiple wires 902 from the conductor in the second end, an electrical circuit may be obtained from positive DC terminal 955 and wires 902 acting as connection to the negative DC terminal 956. The process performed inside the interface-forming apparatus is according to the invention as previously described.

The number of extracted wires 902 depends on the final current density needed to deposit a plating layer on the end surface of the conductor within a reasonable time.

After successfully plating the cable in its second end, the extracted wire may be brought to its original position and may be fastened to the rest of the wires through various traditional means such as through crimping, soldering or screwing.

FIG. 10 illustrates an embodiment of a system for connecting a first cable 1100 and a second cable 1100' according to the invention. Wire restrainers 1152, 1152' fixate the wires of conductors 1101, 1101' thus providing mechanical strength. Wire restrainers 1152, 1152' are made of a conductive material such as copper, aluminium or a steel alloy and may be crimped onto the conductors 1101, 1101'.

The conductors 1101, 1101' comprising conductive wire restrainers 1152, 1152' are inserted into a sleeve 1188. The sleeve 1188 is fastened on the wire restrainers with connection fasteners 1181. The electrical current can now be transferred between the conductors in the two cables. A first electrical pathway between the two conductors is directly through the abutting interface segments 1130, 1130'. A second pathway is from wires of a first conductor 1101, into the interface segment 1130, through connection fasteners 1181 and/or the wire restrainer 1152 fastening the first conductor, into the sleeve 1188, then into the second conductor 1101' through an identical but reversed pathway. In the depicted embodiment, the connection fasteners 1181 are bolts or screws. In other embodiments of the invention, the connection fasteners 1181 may be crimp connections.

The interface segments 1130, 1130' may not abut each other. In such a situation, another electrical pathway is used between the conductors 1101, 1101', such as through the wire restrainers 1152, 1152' and the sleeve 1188. The sleeve 1188 provides mechanical integrity and a robust element that withstands mechanical loads in terms of stress from thermal expansion and contraction. Such varying loads are typical under normal operating conditions of power cables, known as thermal ratcheting.

The sleeve 1188 could also be connected to the wire restrainers 1152 and 1152' by crimping of the pipe piece thus excluding the necessity of mechanical fasteners 1181.

FIG. 11 illustrates an embodiment of a system for connecting a first cable 1200 and a second cable 1200' according to the invention using a socket sleeve 1280, where the conductors 1201, 1201' are brought to abutment with elements inside two mutually oppositely oriented sockets in the sleeve body 1284.

The socket sleeve will be described for one cable 1200, where it is understood that the invention works similarly for the second cable 1200' inserted. The bottoms of a socket are formed as a conduit 1283. After inserting a conductor into a socket satisfactorily, the conduit 1283 is pressed against the interface segment 1230 by a plurality of compression fasteners 1285 pressing against the conduit 1283. Thereby, the conduit 1283 is pressed against the interface segment 1230. A conductive coating 1282 may be applied between the interface segment 1230 and the conduit 1283 thus decreasing the contact resistance between them. Such coating comprises for example gold, silver or tin. Conveniently, the coating is applied to the conduit prior to installation.

Compression fasteners may be compression bolts 1285 being bolts or screws or any other conventional fasteners and/or compression springs 1286 being able to absorb thermal stresses while preferably minimising structural damage.

Instead of compression fasteners 1285 that are adapted to push the conduit 1283 against the interface segment 1230, the sleeve may have pins, fasteners or the like that withholds the conduit in the socket against compression springs 1286. In embodiments with such pins, fasteners or the like, these are released after inserting the cable into the socket, thereby releasing the conduit to press against the interface segment.

Contact is then provided between the two cables 1200, 1200' through the tight abutment of the conductor 1201 into the interface layer 1230 and the conduit 1283, further from the conduit into the compression fasteners 1285, then into the body of the socketed sleeve 1280 and through an identical but reversed pathway to the second conductor. If the wire restrainers 1252 are made of a conductive material and/or if the connection fasteners 1281 are likewise made of a conductive material, a pathway is also present through these elements similar to the second pathway described in relationship with FIG. 10.

Guides 1287 may be used to ensure that conduits 1283 are positioned correctly such as being centered. Further, it may pertain to ensuring an orientation during and after installation, such as ensuring alignment between bores or springs in the conduits 1283 and bores in the socketed sleeve 1280 for compression bolts 1285. The conduits 1283 may have any number of guides.

At least one of the compression fasteners 1285, 1286 or guides 1287 is preferably conductive.

Thermal expansion and contraction during use may be further compensated for by compression springs 1286. Splits may be present prior to inserting the conductors into the socket sleeve 1280, the splits acting to restrain the expansion of the compression springs 1286. After satisfactory insertion of the conductor 1201, 1201' with the wire restrainer 1252, 1252' being securely fastened to the sleeve body 1284 with fasteners 1281, the splits may be removed thus releasing the springs which then act to press the conduit 1283 onto the interface segment 1230, 1230' of the conductors. Further, the springs may then fasten the conduit 1283 to the body of the socket sleeve 1284. Thereby, the compression fasteners 1285 and/or the guides 1287 may be omitted.

By the conduits 1283 being slightly smaller than the space which they occupy inside the sockets of the socket sleeve 1280, disparate thermal expansion of various materials is allowed without deforming elements or being interlocked which may compromise electrical connectivity. Thereby, the embodiment illustrated in FIG. 11 allows a connection that remains effective under the thermal stresses involved with normal use of the cables after installation and thereby provides a robust connection that is also very efficient in terms of transmission efficiency and labour requirements.

By using a socket sleeve 1280 and pressing conduits 1283 against interface segments, connectivity of the interface segment 1230 is increased, and the necessary thickness of the interface segment 1230 is reduced while increasing power transmission efficiency compared to a situation, where the pathway between cables is primarily through the transverse direction along the interface segment 1230 into wire restrainers 1252, fastener connectors 1281 and/or the sleeve 1280. Furthermore, as the transmission is thus ensured through the interface segment 1230 into the abutting conduit 1283, the wire restrainer 1252 is not required to be conductive and may thus be of any convenient material.

FIG. 12 illustrates a termination of a cable 1200 end by using a socket sleeve 1280 being more specifically a termination socket. The socket sleeve 1280 has one socket identical to the socket described in relation to FIG. 11. A conductor 1201 is inserted into the socket of the socketed sleeve 1280 so that its interface segment abuts a conduit 1283. Then, it is fastened with connection fasteners 1281 to provide mechanical strength. Afterwards, the compression fasteners are activated. Activating relates to insertion for compression bolts, whereas for compression springs, activating relates to releasing them, such as by removing a split. In its opposite end, the termination socket has any convenient termination for interfacing with electrical systems of various types as part of a termination body 1290 which is generally used for connection fitting a power cable to a busbar system or an overhead line. The form may vary depending on the application which is comprised by a terminal lug with a hole 1292 or alternatively a bolted termination, and the body may consist of a busing 1291 to control the shape and strength of the electric field and reduces the electrical stresses in the insulating material.

In an embodiment of the termination socket, it interfaces with traditional cable terminations. In another embodiment, it interfaces with other power line types or other power system interfaces such as transformers.

FIG. 13A illustrates forming an interface segment according to an embodiment of the invention. A cold spraying device 760 is supplied. In the illustrated embodiment, the cold spraying device 760 may be handled in hand held fashion and operated by one person, or be mounted on an automated device. A pressurised propeller gas is supplied to the gas heating chamber 765 where it may reach a pressure of up to 100 bar, the propeller gas being supplied from the propeller gas inlet 762. Feedstock 767 is supplied from the powder feeder 766 through the feedstock inlet 764 using a carrier gas. The carrier gas and the propeller gas typically has the same source. The feedstock includes at least the particulate conductive material. The propeller gas is then mixed with the feedstock 767 after heating, and the feedstock 767 exits the cold spraying device 760 at accelerated speeds by the nozzle 761 and deposits onto the cable end 720. The feedstock may include any mix of materials, preferably including the material of the wires and/or other materials selected for mechanical stability, chemical stability or electrical properties, and may for example be gold, silver, aluminium, copper or tin.

In the illustrated embodiment, the cable end is fixed with a ferrule 724 to improve work ease, cable end structural stability and electrical interaction of the cable end. In other embodiments, a low pressure cold spraying device or a high pressure cold spraying device may be mounted onto the cable end or around the cable sides and operate in an automated fashion using a robot or any type of motion control in forming the interface segment comparable to the devices and methods described for example in previous figures. The build-up of the desired deposition material onto the cable end may comprise building individual protrusions onto wires that tapers off outwards, as the material has difficulty adhering to the often-uneven surface of the cable end surface, especially between the wire ends. This may be compensated by cold spraying a filler material such as tin to fill in the gaps afterwards, between the protrusions. Advantageously, the interface segment may then be polished, abraded or otherwise evened, after which an additional layer of a preferred, conductive material can be used to make a complete end surface for optimal structural and electrical properties. Other combinations of deposition material compositions may be thought of by the skilled person, such as mixing the preferable deposition material with a ductile material having better adherence to the uneven surface, or by using specific stepwise processes. The carrier gas including feedstock and the propeller gas flows in the direction F.

FIG. 13B illustrates a first step of a cable joining according to the invention. The cable ends 720, 720' are crimp joined using a ferrule 724, leaving as little space between wires and the two cable ends as convenient and the two cables optionally touches or abut in the middle. To improve the physical connection between the two cables, a thin compressible temporary support element may be placed between the two cables prior to crimping the ferrule, for removing through-holes before cold-spraying. It may consist of soft metal sheets, rubber or foam sheets, which improves deposition of cold sprayed material afterwards.

In the illustrated example, the top half of both cable ends is then cut, sawed, milled or in another way removed in a tapered V-shape towards the middle, the cut extending to the middle of the cable. This allows working with the joint from the side, and facilitates cold spraying an interface segment onto the two ends, electrically and mechanically joining them.

FIG. 13C illustrate a joint where the process described for FIG. 13B has been performed on the top side of the cable, after which an interface segment has been cold-sprayed onto it, filling the V-shaped gap, after which the process has been repeated for the bottom half of the cable, where after a joined interface segment 730 is formed that electrically join the two cables. Thereby a method is achieved that allows easy joining of cable ends with high quality connection.

The interface layers 730, 730' may be built up from substantially perpendicular to the cable, building material until an electrical connection is achieved among all desired wires of the cable and/or until a satisfactory mechanical connection has been established. The ferrule 724 may be removed after joining the cables or it may be left in place.

FIG. 13D-FIG. 13I illustrate various process steps in cold-spraying a conductor end surface. In an embodiment, the process of cold-spraying to create an interface segment on a conductor end surface comprise the following steps in the alphabetical order of the drawings in which they are illustrated. In other embodiments, the process steps are used in any order and combination of steps as well as repetitions. For example, applying a layer of particulates and sanding it after may be repeated cyclically for as many times as it takes to achieve a desired result. In a particular embodiment, the process comprise substantially the processes and order described with FIGS. 13*d*, 13E, 13G, and 13I.

FIG. 13D illustrates using a needle hammer 1345 to flatten out the conductor end 1320 before adding any material. This is a pre-treatment step. Hammering before depositing the conducting material deforms the conductor end 1320 slightly, each wire 1302 being hit deforming to fillgaps between wires 1302 to improve the ability of the conductive coating to bind to the conductor end surface 1320, as it better constitutes a single surface after hammering. Hammering may thus help in removing gaps between wires.

FIG. 13E illustrates depositing a first, conductive material 1367A onto the conductor end surface 1320, using cold-spraying device 1360. Some materials may be desirous to use, which are too hard to form a perfectly uniform surface. For example, some materials will not adhere to the edges of strands/wires or between them on softer material, but will bury deeper into the conductor, erode the material or simply fall off, while the material will adhere on the ends of the wires themselves. This is seen in the figure, where wire protrusions 1347 are formed. Over time, cold-spraying builds wire protrusions 1347 on the surface. The illustrated height of the protrusions 1347 are exaggerated for illustrative purposes. Although they appear often on the wire ends, they may form anywhere. Electrical connection may be achieved between some of the wires, but not all. Copper and silver are two suitable example materials.

FIG. 13F illustrate the process of depositing a second, filler material 1367B on the conductor end 1320. This material is chosen for its ability to conform to and attach to the surface produced by the wire protrusions, and to withstand subsequent processing (discussed below). The filling material 1347 fills the holes between the wire protrusions 1367, but may cover some wire protrusions 1347 completely, which may effectively encapsulate them. Tin, annealed copper or silver may be used as a filler material 1367B. It is desirable to created an electrical pathway between the first conductive material 1367A and the second filler material 1367B. Plastics or ceramics may be used if wire protrusions are completely exposed in a subsequent abrading step, as it allows complete electrical connection between protrusions with subsequently applied conductive material 1367A. In other words, the filling material 1367B may be electrically conductive and applied for its softness compared to the first conductive material 1367A, or to serve another purpose.

FIG. 13G illustrate abrading the deposited materials with a sander 1346. Any other suitable removal procedure may be used as well, such as cutting, shaving or chiseling, making sure not to peel the layers off the cable end. After this process, a substantially flat surface is provided, where wire protrusions 1347 of the first, electrically conductive material 1367A, are preferably exposed through the filler material 1367B, or alternatively, where the filler material is conductive. In any regard, all wires have an electrical pathway to the end surface of the cable which is harder than before treating.

FIG. 13H illustrate hammering the surface with a needle hammer 1345 again to flatten the surface and compress the deposited material, which may improve mechanical and electrical characteristics. Although FIG. 13H illustrate hammering the deposited materials, hammering may take place before, while or instead of depositing the filling material 1367B as well as before, while or instead of depositing the conductive material 1367A as well.

FIG. 13K illustrate adding another layer of conductive material 1367C on top of the abraded or otherwise treated deposited material(s). Thus, an interface segment 1330 is produced with a low electrical resistance and a high mechanical strength that builds an electrical connection between all the wire ends of the conductor. The second conductive material 1367C may be identical to the first conductive material or it may be a different type of material.

In embodiments, the cold-spraying device may utilise mixed material compositions. A useful example is to add a peening material to the sprayed material composition. A peening material does not adhere to the surface, but falls off after impact, deforming the impacted area, or becomes embedded inside the deposited conductive material (x67A) or filler material (x67B). Depositing a conductive material onto the end surface may be improved by adding a peening material to the mix. At least as much as 50 vol. % of the material may be peening material, improving the mechanical and electrical characteristics of the deposited material.

FIGS. 13J-13K illustrate an example cold-spraying device 1360/interface forming device 1360 attached to a fastening system 1379. The cold-spraying device 1360 attaches reversibly to a fastening system 1379, which is fastened to the cable 1300. The cold-spraying device 1360 comprises a local enclosure 1363 that creates a closed environment around the cable end 1320 and the spray nozzle 1361; a motorised nozzle control 1374; a material and pressure suction channel 1369; and a vent 1368.

FIG. 13J is a perspective view of the cold-spraying device 1360. It is user friendly to attach to—, and subsequently detach from the cable 1300 using the fastening system 1379 (not shown on FIG. 13J) as an interface, and works in an automated fashion to create an interface section. Two cold-spraying devices 1360 may be mounted on two opposite cable ends to quickly prepare for joining them. They may also conveniently be used on cables off-situ, such as at the production facility, to prepare at least one cable end. After attaching the cold-spraying device 1360 to the cable 1300, three motors 1374X, 1374Y (not shown) and 1374Z move the cold-spraying device relative to the centre of the cable end 1320 to build the interface segment.

FIG. 13K is a cross-sectional view of the cold-spraying device. When the cold-spraying device 1360 having a nozzle 1361 that extends into the local enclosure 1363 moves, the membrane that forms the wall 1378 of the local enclosure 1363 adapts to the movement, thus allowing full freedom of the deposition means/nozzle 1361 in the X-, Y-, and Z-directions relative to the cable end surface 1320 within the local enclosure 1363.

The cold-spraying device 1360 attaches to the cable 1300 via a fastening system 1379. The fastening system 1379 may be any conventional structure. The illustrated is a three-piece pressure fit, which is at first attached to the wire restrainer 1324 at the desired location by tightening the pressure screws 1379D. This pulls pieces 1379A and 1379C together, which in turn presses piece 1379B towards the wire restrainer/crimp 1324 to achieve a firm fit. The cold-spraying device 1360 can subsequently be mounted on the fastening system through a mutual interface. A cable profile relating to the cable type may be loaded onto the device or it may further have sensors to read the conductor end surface 1320 size and other relevant information. In any regard, the affixing allows the device to clamp and fasten to orient itself relative to the cable 1300, and thus deposit the desired material onto the conductor end surface in an automated fashion without human intervention. The fastening system 1379 also includes a gasket 1393 running the periphery of the cable to keep any dust to leave or damage the cable 1300. The fastening system interface allows demounting the cold-spraying device 1360 to inspect the building interface layer/cable end surface, to perform manual treatment using hand tools, or even to mount a different tool to perform other types of automated tasks, such as abrading or needle hammering.

The cold-spraying device 1360 further has a local enclosure 1363. The wall of this local enclosure 1363 is made at least partially from an elastic material and is constructed so as to enclose the conductor end 1320 completely, or even an end portion of the cable 1300. The spray nozzle 1361 extends into the local enclosure 1363 through a gas-tight seal 1349, allowing depositing material 1367 without the material getting out of the enclosure 1363. The personnel do not get into contact with the deposition material 1367, nor the machine parts. However, a skilled operator can change spare parts and perform maintenance on the nozzle and in the local enclosure. This improves work conditions and materiel lifetime, respectively. Furthermore, no large spray booth has to be set up for every cable joining or termination to seal off the deposition area, which decreases cost of installation.

A suction channel 1369 extends from the bottom of the local enclosure in FIG. 13J, where the material exits due in part to gravity and for some embodiments, due in part to an active suction. In other embodiments, the suction may be placed in other locations, such as above the cable end. In yet other embodiments, the channel may be placed farthest away from the cable end surface 1320. The cold-spraying device 1360 sprays pressurised air with dispersed particles against the cable end 1320 at a predetermined flow rate. In a preferred embodiment, the suction channel 1369 matches the flow rate of the inlet flow, whereby there is atmospheric pressure in the local enclosure 1363. To alleviate any slight mismatch that might occur between the inlet flow and the outlet flow, a filter 1368 allows depressurization of the local enclosure 1363, whether to increase or decrease the pressure, to match the outside pressure.

The motorised nozzle control 1374 consists of motors acting in three dimensions to allow translational movement in X, Y and Z directions. For example, stepper motor 1374X provides rotation to the threaded spindle 1399, which serves to move the nozzle towards the cable end surface 1320.

In an embodiment, the motorised nozzle control 1374 provides movement parallel to the cable end surface only.

FIG. 14 illustrate a pre-treatment using laser according to the invention. FIG. 14A is a view of the cable 800 with cable end 820 and wires 802 after removal of protective layers.

FIG. 14B illustrate a close-up partial view of the cable end of FIG. 14A. Using a laser device 860, an energy is transferred to the cable end that is insufficient to significantly affect the wires while it is sufficient to evaporate the reactive compound, in the illustrated embodiment, the varnish 804. As can be seen, the laser device used in the pre-treatment has removed the outermost varnish in a treatment area 861, to a certain depth, 804'. This method is advantageously performed using a pattern recognition software to identify reactive compound and control the laser device 860.

Thereafter, a laser process or other method may be used to build an interface segment according to the invention.

FIG. 15 illustrates a conduit 1583 or other connection element being spiked on the surface that is to attach to the interface segment 1530. Initially, a cable 1500 is provided and wires are crimped using a wire restrainer 1552.

In the shown embodiment, connection fasteners 1581 are crimp connectors, where a force applied to the outside of the sleeve 1598 compresses the conductor and deforms the wire restrainer 1552, creating at least a frictional fit between the sleeve and the wire restrainer as well as a good electrical pathway. A reinforcement ring 1589 integrated in the wire restrainer 1552 made of a material much stiffer than the wire restrainer material can prevent any further deformation of the conductor wires 1502 when sleeve 1598 is compressed onto the wire restrainer 1552. The reinforcement ring 1589 will prevent any further deformation of wires into the applied interface segment 1530. In the same manner, the wire restrainer 1552 has been crimped onto the wires, creating a tight fit around the strands/wires and deforming their cross sectional area, as can be seen in the figure, as well as in the following figures.

By pressing a spiked conduit 1583 in the axial direction H against the interface segment 1530, an improved connection is achieved between the two elements, since several contact points are created. Conventionally, pressing two flat surfaces to abutment achieves at first only three points of connection before the surfaces rests against each other. Increasing the contact surface requires applying substantial force. Furthermore, the contact points crated in the end will conventionally be both randomly distributed along the surfaces as well as of random sizes. By providing a spiked conduit 1583 and pressing it into the interface segment, a more even distribution of contact points is then achieved, hence a more even current distribution over the interface segment 1530 is achieved when axially connected.

Since axial contact is achieved, an electrical pathway is created directly through the axial direction. In embodiments where this electrical connection is adequately sufficient to carry a significant portion of, or the full current load, the sleeve 1598 may be adapted to provide mechanical fastening as well as, or instead of, power transfer. For example, the sleeve may be made from steel and comprise a thread for more easily pulling the cables together.

The shown embodiment conduit 1583 or other connection element being spiked may be used in conjunction with other embodiments described in the present specification as the skilled person will realise, such as in conjunction with the socket sleeves 1284, 1384 described in relation to FIGS. 11 and 12.

FIG. 16 illustrates an angular interface segment 1632 that has an uneven thickness in the radial direction of the cable 1600. For terminations or connections relying on electrical power transfer through a sleeve 1688, the required thickness of the interface layer 1633 is highest farthest out along the radial direction, where more current flows due to the cumulative conductor cross sectional area. Therefore, the interface layer can be thinner at the centre, saving material.

The angular interface segment 1632 need not be curved, as illustrated but may simply be inversely cone-shaped with straight edges from the radial far edge to the centre of the interface segment 1632.

FIG. 17 illustrates a variation of the interface layer of FIG. 16. Instead of varying the thickness of the interface layer itself, a conductive flanged end plate may be attached over the cable end, the flanged end plate 1733 having a hole in the middle. The procedure is as follows: An interface layer 1730 is formed in a minimally suitable thickness to allow a current to flow from the inner strands outwards, and to supply an initial mechanical strength for subsequent processing. Then, the flanged end plate 1733 is attached over the interface segment 1730. The hole in the middle hereof corresponds to where the required thickness is equal to or lower than the thickness of the initially formed interface segment 1730. This end plate is then advantageously attached firmly with a hydraulic press or the like. By using such an end plate, the electrical resistance is lowered from the cable end, through the interface segment and out along the radial direction to a ferrule/wire restrainer 1752 or other radial attachment means. The flanged end plate may be sloped as well, levelling off towards the hole in the middle of the cable.

In FIG. 17B, an embodiment is shown that is otherwise identical to the one shown in FIG. 17A, except for what is discussed here. The embodiment is shown from the axial direction. Instead of a flanged end plate 1733, a concentrically circled end plate 1734 is supplied, which has flanges as the flanged end plate, and whose end plate part is separated into discrete plate parts 1734A, 1734B and 1734C. The plate parts are at least substantially free from each other and may be pressed against the interface segment without affording each other stiffness. They may be attached to each other in a sliding fashion or through a couple of attachment 'bridges'. For example, a concentric maze-like pattern may be cut into the end plate to form inner and an outer plate parts that are integrally formed but supply minimal stiffness to each other.

Any number of plate parts may be used, and the plates need not be concentric. Furthermore, they may be attached at several points to provide decreased electrical resistance while maintaining low stiffness.

FIG. 17C illustrates an embodiment where the end plate is a pie-shaped flanged end plate 1735. Each individual end plate pie 1735A, 1735B . . . may be individually machined to fasten against the interface segment 1730, significantly reducing the force needed for attaching the end plate. Furthermore, the travel direction of the electrical current being from the centre and outwards in the radial direction of the conductor, a pie-shaped flanged end plate 1735 provides a low electrical resistance in the desired direction.

FIG. 18 is a cross-sectional view of a double-wedge sleeve system for axially connecting two cables according to the invention. Two cables 1800, 1800' are supplied for connection. After attaching wire restrainers 1852 and a sleeve 1898 preferably having conduit 1883, 1883', the wedges 1836, 1836' may be pushed along directions J and J', respectively, to supply a tight fit of the conductor ends.

The conduit 1883 may not be attached firmly in the axial direction, or they may be attached firmly against the interface segments 1830. If used, the conduit 1883 protect the interface segments 1830 against the frictional forces and hence structural damage that may be caused to them by the wedges 1836, 1836'.

The wedges 1836, 1836' sit in slits (not illustrated) for support. In an embodiment, the wedges 1836, 1836' are forced against each other with a hydraulic press or other machinery to produce the necessary force. To help reduce the friction of the wedges 1836, 1836', they can be lubricated prior to insertion. After insertion, a solvent is preferably used to remove the lubricant. This serves to affix the wedges in place as well as to reduce transition resistance between them, if they are used to conduct electricity between the two cables 1800, 1800'.

In an embodiment, the wedges 1836, 1836' are maintained by springs after properly securing them into position. In an embodiment, the wedges 1836, 1836' are fixed in place after a suitable insertion is achieved, such as through a teethed side/ratchet-like mechanism, through being welded into place, or through any other convenient method.

Figure 19A:
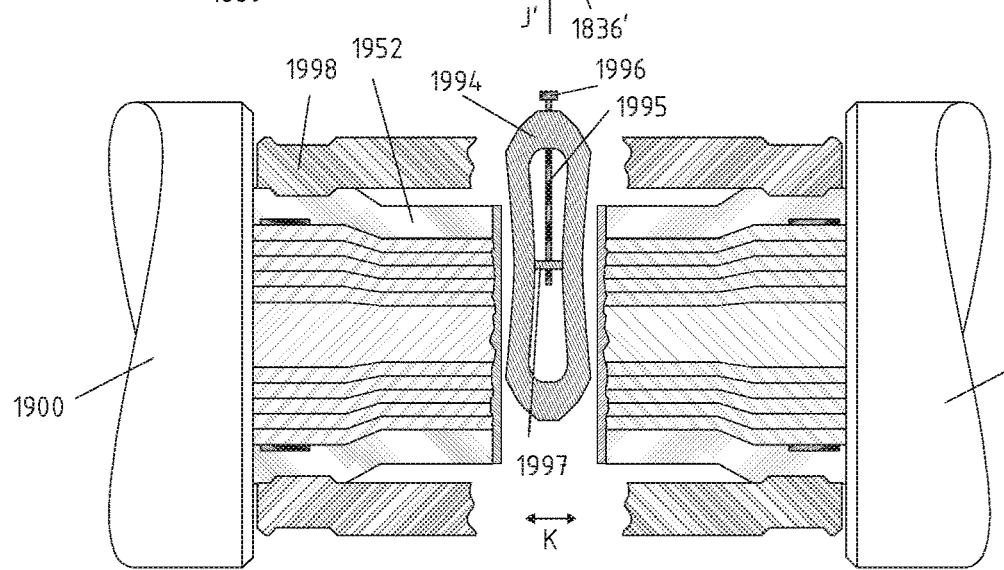
Figure 19B:
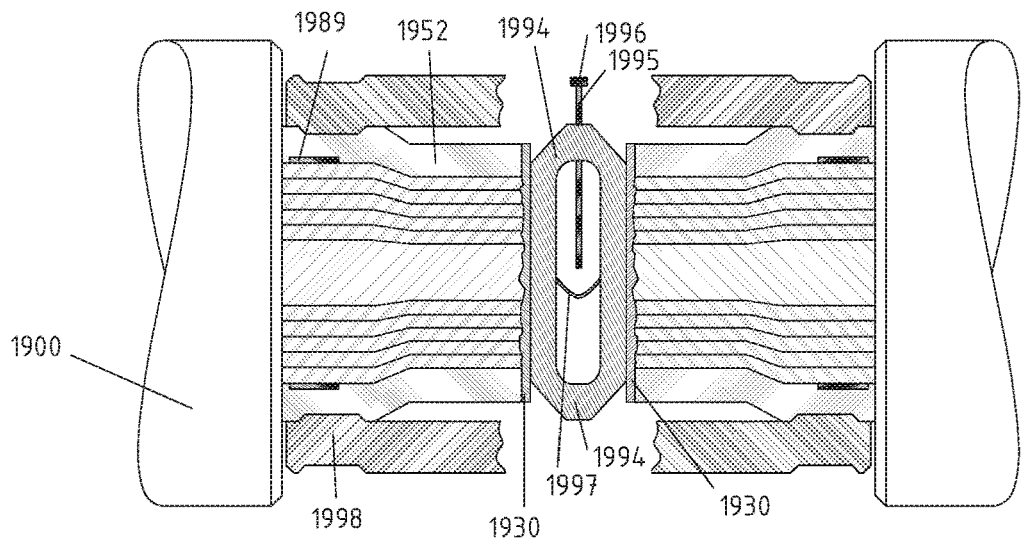

FIGS. 19A and 19B illustrate another embodiment of an expansion element for joining two power cables 1900, 1900'.

A spring-loaded element 1994 being electrically conductive is supplied pre-tensioned within its elastic deformation range. In FIG. 19A, it is being inserted between the interface layers through a slot in a sleeve 1998. Alternatively, it may be inserted as part of a conduit in a different physical arrangement relative to the rest of the sleeve 1998, such as inside a socket as in FIG. 11 or 12 instead of or in addition to the conduit placed there. The spring-loaded element 1994 comprises a body, a compression bolt 1995 with a head 1996, as well as a tightening thread 1997. The tightening thread may consist of a metal wire being wound by manipulating the thread 1995 from outside its closed body, or any other convenient structure.

After the spring-loaded element 1994 has been placed in the intended location, the tension is released by loosening/unscrewing the compression bolt 1994. When the tension is released, the spring-loaded element pushes against the interface segments 1930 along the axis K, whereafter it supplies an electrical connection between the surfaces. Instead of abutting directly onto the interface segments 1930, the spring-loaded element 1994 can be used in something like the socket sleeve shown in FIG. 11 as a conduit.

FIG. 19B illustrate the cable connection after the spring-loaded element 1994 has its elastic deformation partially released. With expansion and contraction, the spring-loaded element 1994 remains effective at transferring an electrical current.

In a preferable embodiment, the spring-loaded element has spiked sides as described with FIG. 15.

EMBODIMENTS

In the following, embodiments of the invention are listed.

A. A method for providing an electrically conductive power transmission interface (x30) on the end surface of a power cable (xOO) having at least two separate wires being electrically conductive, the cable further comprising a reactive compound different from the wires, the method comprising the steps of:
  providing an end section of said power cable, said end section comprising wires having wire ends, the end section further having said reactive compound,
  characterised by forming an interface segment onto the end section of said cable by successively adding electrically conductive particulates onto said end section to achieve an interface segment having:
    a melting point being higher than the melting point of said reactive compound,
    an electrical resistance below 0.6 mΩmm² as an average among 80% of the wires, and
    a mechanical tensile adhesive strength above 5 MPa.

B. A power cable (xOO) having at least two separate wires being electrically conductive, the cable further comprising a reactive compound different from the wires for providing further features to the power cable, the cable further comprising
  a cable end having wire ends (x22) and said reactive compound within a distance of 5 mm from the cable end surface (x20),
  characterised by said cable further comprising an electrically conductive power transmission interface (x30) extending from said cable end surface and being integrally formed with said wire ends, where said electrically conductive power transmission interface (x30) has:
    a melting point being higher than the melting point of said reactive compound,
    an electrical resistance below 0.6 mΩmm2 as an average among 80% of the wires, and
    a mechanical tensile adhesive strength above 5 MPa.

C. A sleeve (x80) for joining a power cable (xOO) according to embodiment B to an electrical interface being a power cable (χOO') or a cable termination (1390), the sleeve (x80) comprising:
  a sleeve body (x84) forming at least one socket for receiving a cable (xOO) further having a conductive channel from said socket to said electrical interface, characterised by further comprising
  a conduit (x83) inside the at least one socket being conductive and displaceable relative to the body (x84) having a surface facing out of said socket for providing electrical contact to an end segment (x20) or interface segment (x30) of an inserted cable (xOO), and
  a spring fastener (x85, x86) allowing fastening said conduit (x83) against said interface segment (x30) by applying and maintaining an axial force on the conduit (x83) towards the cable (200) relative to the sleeve body (x84), and
  where said conduit (x83) is in electrical connection with said sleeve body directly and/or through said compression fastener (x85, x86), whereby a current may flow from said conductor (x01) to the interface segment (x30), then over said conduit (x83), into said body (x84) and to said electrical interface.

D. A sleeve (x80) for joining a power cable (xOO) according to embodiment B to an electrical interface being a power cable (χOO') or a cable termination (1390), the sleeve (x80) comprising:
  a sleeve body (x84) forming at least one socket for receiving a cable (xOO) further having a conductive channel from said socket to said electrical interface, characterised by further comprising
  a conduit (x83) inside the at least one socket being conductive and displaceable relative to the body (x84) having a surface facing out of said socket for providing electrical contact to an end segment (x20) or interface segment (x30) of an inserted cable (xOO), and
  a compression fastener (x85, x86) allowing fastening said conduit (x83) against said interface segment (x30) by applying and maintaining an axial force on the conduit (x83) towards the cable (200) relative to the sleeve body (x84), and
  where said conduit (x83) is in electrical connection with said sleeve body directly and/or through said compression fastener (x85, x86), whereby a current may flow from said conductor (x01) to the interface segment (x30), then over said conduit (x83), into said body (x84) and to said electrical interface.

The invention claimed is:

1. A method for providing an electrically conductive power transmission interface on the end surface of a power cable having at least two separate wires being electrically conductive, the cable further comprising a reactive compound different from the wires for providing further features to the power cable, the method comprising the steps of:
  providing an end section of said power cable, said end section comprising wires having wire ends, the end section further having said reactive compound, and wherein at least a portion of said reactive compound is located among said at least two separate wires; and
  successively adding electrically conductive particulates onto said end section by bringing the conductive particulates being dispersed in a non-adhering carrier fluid of a different material than said conductive particulates into contact with said end section,
  wherein the reactive compound is present as part of the original power cable prior to end section preparation.

2. A method according to claim 1, further comprising the step of:
  providing a dispersion of said electrically conductive particulates in a nonadhering fluid of a different material than said conductive particulates.

3. A method according to claim 1, further comprising the step of:
  providing an enclosure boundary delimiting a local enclosure from an outside environment, the enclosure boundary having an open end for receiving a cable end into said local enclosure, further where said cable is provided into said open end of said enclosure boundary to provide at least a dust-tight seal between the local enclosure and an outside environment, where the deposition means is provided inside said local enclosure.

4. A method according to claim 1, further comprising the step of continuing said successively depositing until said power transmission interface has been integrally formed with said at least two wire ends of said wires.

5. A method according to claim 1, wherein said successively adding may be chosen from a list of: cold spraying, electroplating, or laser metal deposition.

6. A method according to claim 1, wherein said successively adding is successively cold-adding, where the parameters relating to temperature is controlled to ensure the temperature of the reactive compound remains below a reactive temperature, at which reactive temperature said reactive compound interferes with said successively adding to impede the electrical and/or mechanical properties of said electrically conductive power transmission interface and/or where the reactive compound damages the cable at said reactive temperature.

7. A method according to claim 1, where said forming is cold spraying, where said cold-spraying is performed by:
depositing a first conductive material and
depositing a filler material.

8. A method according to claim 7, further comprising the steps:
after said filler material has been deposited, the end surface is treated to expose deposited first conductive material, and
a second layer of conductive material is deposited onto said end surface to integrally interact with the deposited first conductive material.

9. A method according to claim 1, further comprising a step of hammering or peening where the end surface of the conductor or the interface layer is subjected to mechanical compressive forces.

10. A method according to claim 1, wherein the reactive compound is non-conductive.

11. A method according to claim 1, wherein the reactive compound comprises at least one of varnish, insulation paper, polymer, swelling powder, bitumen, waxes, epoxies, silicones, asphalts, gels, hydrocarbon resins or material of a semiconductor layer.

12. A method according to claim 1, wherein the reactive compound extend longitudinally along the power cable.

13. A method, comprising:
using a cold spraying apparatus for forming a power transmission interface on a power cable having at least two wires and a reactive compound located among said at least two separate wires and wherein the reactive compound is non-conductive.

14. A method for providing an electrically conductive power transmission interface on the end surface of a power cable having at least two separate wires being electrically conductive, the cable further comprising a reactive compound different from the wires for providing further features to the power cable, the method comprising the steps of:
providing an end section of said power cable, said end section comprising wires having wire ends, the end section further having said reactive compound, and wherein at least a portion of said reactive compound is located among said at least two separate wires; and
successively adding electrically conductive particulates onto said end section by bringing the conductive particulates being dispersed in a non-adhering carrier fluid of a different material than said conductive particulates into contact with said end section,
providing an enclosure boundary delimiting a local enclosure from an outside environment, the enclosure boundary having an open end for receiving a cable end into said local enclosure, further where said cable is provided into said open end of said enclosure boundary providing at least a dust-tight seal between the local enclosure and an outside environment, where the deposition means is provided inside said local enclosure.

15. A method according to claim 14, wherein the method comprises inserting said cable end into said local enclosure.

16. A method according to claim 14, wherein the method comprises providing a suction to the local enclosure to remove excess deposition material.

17. A method according to claim 14, wherein providing the dust-tight seal between the local enclosure and an outside environment encloses the conductor end completely.

* * * * *